US011721663B2

(12) United States Patent
Chen et al.

(10) Patent No.: US 11,721,663 B2
(45) Date of Patent: Aug. 8, 2023

(54) MULTI-LEVEL STACKING OF WAFERS AND CHIPS

(71) Applicant: Taiwan Semiconductor Manufacturing Co., Ltd., Hsinchu (TW)

(72) Inventors: Ming-Fa Chen, Taichung (TW); Cheng-Feng Chen, Zhubei (TW); Sung-Feng Yeh, Taipei (TW); Chuan-An Cheng, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 291 days.

(21) Appl. No.: 17/074,107

(22) Filed: Oct. 19, 2020

(65) Prior Publication Data

US 2021/0375819 A1   Dec. 2, 2021

Related U.S. Application Data

(60) Provisional application No. 63/031,087, filed on May 28, 2020.

(51) Int. Cl.
*H01L 23/28* (2006.01)
*H01L 23/367* (2006.01)
*H01L 25/065* (2023.01)
*H01L 23/00* (2006.01)
(Continued)

(52) U.S. Cl.
CPC .............. *H01L 24/80* (2013.01); *H01L 21/78* (2013.01); *H01L 24/08* (2013.01); *H01L 25/0657* (2013.01); *H01L 25/50* (2013.01); *H01L 2224/08145* (2013.01); *H01L 2224/80006* (2013.01); *H01L 2224/80895* (2013.01);
(Continued)

(58) Field of Classification Search
CPC ............. H01L 25/0657; H01L 21/6835; H01L 2225/06541; H01L 24/97; H01L 2225/06513; H01L 2224/97; H01L 2224/16145
See application file for complete search history.

(56) References Cited

U.S. PATENT DOCUMENTS 10,475,762 B1 * 11/2019 Yeh ...................... H01L 23/481
10,879,224 B2   12/2020 Chen et al.
(Continued)

FOREIGN PATENT DOCUMENTS

TW   202013658 A   4/2020
TW   202017131 A   5/2020

*Primary Examiner* — Anthony Ho
*Assistant Examiner* — David J Goodwin
(74) *Attorney, Agent, or Firm* — Slater Matsil, LLP

(57) ABSTRACT

In a method, a wafer is bonded to a first carrier. The wafer includes a semiconductor substrate, and a first plurality of through-vias extending into the semiconductor substrate. The method further includes bonding a plurality of chips over the wafer, with gaps located between the plurality of chips, performing a gap-filling process to form gap-filling regions in the gaps, bonding a second carrier onto the plurality of chips and the gap-filling regions, de-bonding the first carrier from the wafer, and forming electrical connectors electrically connecting to conductive features in the wafer. The electrical connectors are electrically connected to the plurality of chips through the first plurality of through-vias.

20 Claims, 19 Drawing Sheets

(51) Int. Cl.
 *H01L 25/00* (2006.01)
 *H01L 21/78* (2006.01)
(52) U.S. Cl.
 CPC ............... *H01L 2224/80896* (2013.01); *H01L 2225/06541* (2013.01)

(56) References Cited

U.S. PATENT DOCUMENTS

| | | | |
|---|---|---|---|
| 2011/0063815 A1* | 3/2011 | Lu | H01L 24/05 361/803 |
| 2012/0276716 A1 | 11/2012 | Chandrasekaran et al. | |
| 2018/0158749 A1* | 6/2018 | Yu | H01L 23/3736 |
| 2019/0027465 A1 | 1/2019 | Yeh et al. | |
| 2019/0333871 A1 | 10/2019 | Chen et al. | |
| 2020/0219852 A1* | 7/2020 | Haba | H01L 22/20 |

* cited by examiner

MULTI-LEVEL STACKING OF WAFERS AND CHIPS

PRIORITY CLAIM AND CROSS-REFERENCE

This application claims the benefit of the following provisionally filed U.S. Provisional Application No. 63/031,087, filed on May 28, 2020, and entitled "Multi-Level Stacking Approach," which application is hereby incorporated herein by reference.

BACKGROUND

In the packaging of integrated circuits, multiple levels of chips may be packaged into a same package. The multiple levels of packaging need to go through a plurality of pick-and-place processes to stack multiple individual chips. For each level of the chips, the chips need to be manufactured in the form of wafers, and sawed from the respective wafers. The chips are then picked and placed, followed by gap-filling and planarization processes. Accordingly, the packaging process has long process cycle time, low throughput, and high cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
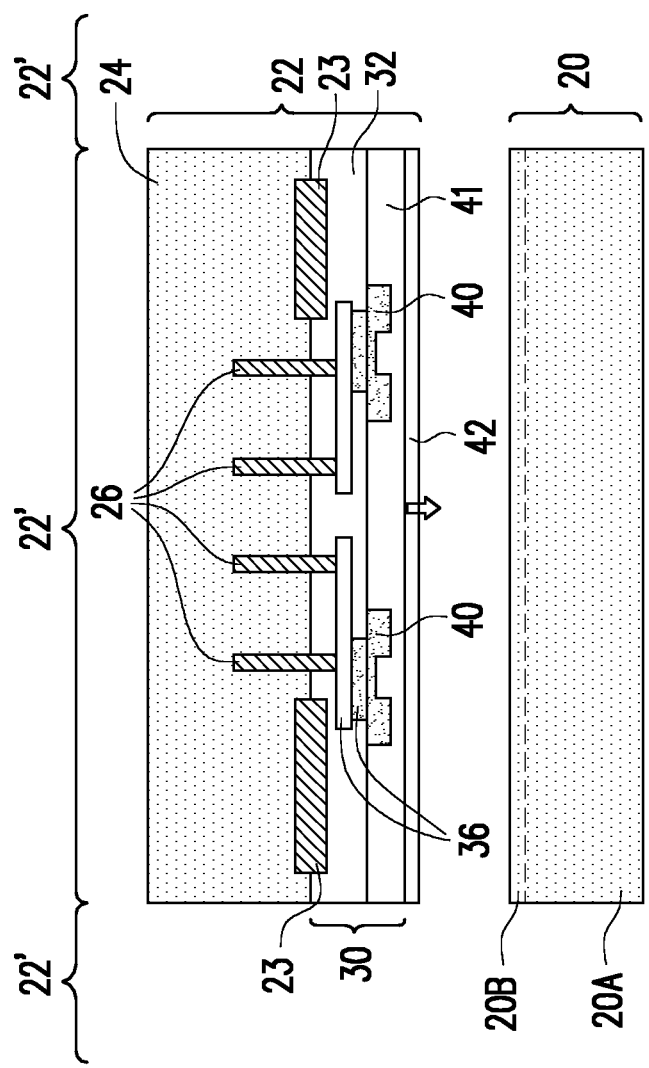
FIGS. 1A, 1B, 2A, 2B, 3, 4A, 4B, and 5-8 illustrate the cross-sectional views and perspective views of intermediate stages in the formation of a chip stack in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package having stacked chips (also referred to as chip stacks) and the method of forming the same are provided in accordance with some embodiments. In accordance with some embodiments of the present disclosure, the packaging process includes bonding at least one wafer to chips or other wafers. The gaps between the chips at the same level are filled with gap-filling materials. Through the use of wafer(s), instead of chips that are picked-and-placed one-by-one, the throughput of the packaging process is improved, and the cost of manufacturing is saved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A, 1B, 2A, 2B, 3, 4A, 4B, and 5-8 illustrate the cross-sectional views and perspective views of intermediate stages in the formation of a package including stacked chips in accordance with some embodiments of the present disclosure. The corresponding processes are also reflected schematically in the process flow shown in FIG. 27.

Figure 1A:
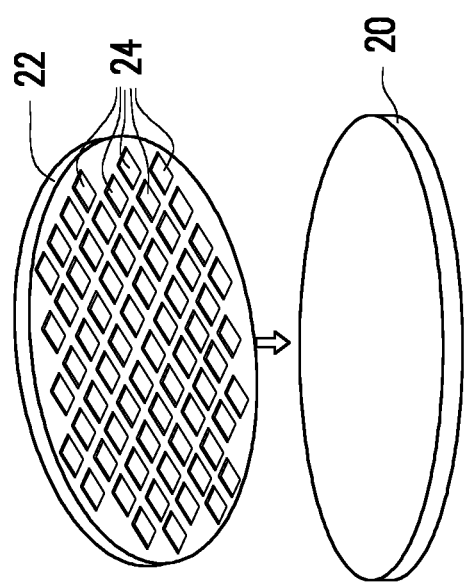

FIGS. 1A and 1B illustrate a perspective view and a cross-sectional view, respectively, of the aligning and the placing of device wafer 22 onto carrier 20. In accordance with some embodiments, an entirety of carrier 20 is formed of a homogeneous material, which may include silicon, and the homogeneous material may be in the form of elemental element(s) or a compound. For example, carrier 20 may include (elemental) crystalline silicon, or a silicon compound such as silicon oxide, silicon nitride, silicon oxynitride, or the like. Carrier 20 may also have a composite structure, for example, with a base layer 20A and a top surface layer 20B over the base layer 20A. The base layer 20A may be a silicon layer (such as a crystalline silicon layer), glass, or other types of semiconductor or dielectric layer. The top surface layer 20B may be a silicon-containing layer (amorphous or polycrystalline silicon) or a silicon compound layer comprising silicon oxide, silicon nitride, silicon oxynitride, or the like. In accordance with some embodiments, each of the base layer 20A and the top surface layer 20B is a homogeneous layer formed of a homogeneous material. Top surface layer 20B may be formed through deposition, thermal oxidation, nitridation, and/or the like. Carrier 20 is free from active devices (such as transistors and diodes) and passive devices (such as capacitors, resistors, inductors). Carrier 20 may also be free from conductive lines such as metal lines therein.

FIGS. 1A and 1B also illustrate device wafer 22 in accordance with some embodiments. The subsequently discussed device wafers 22 (such as wafers 20-1 through 20-$m$ (FIGS. 10, 18, and 26, wherein m may be any integer greater than 2)) may have similar or a same structure as device wafer 22, hence the details of the subsequently used wafers 22 are not discussed in detail, and the details may be found referring to the discussion of wafer 22 in FIG. 1B. Wafer 22 includes a plurality of device chips 22' therein. Device wafer 22 is un-sawed, and includes semiconductor substrate 24, which continuously extends throughout (to all edges) of wafer 22. In accordance with some embodiments, substrate 24 is a semiconductor substrate, which may be formed of or comprise a crystalline silicon substrate, while it may also be formed of or comprise other semiconductor materials such as silicon germanium, silicon carbon, or the like. In accordance with some embodiments, device chips 22' include circuits 23 formed at the front surface (the illustrated bottom surface) of semiconductor substrate 24. Circuits 23 include active circuits (not shown) such as transistors and possibly passive devices such as capacitors, resistors, inductors, and/or the like. Through-vias (sometimes referred to as Through-Substrate Vias (TSVs)) 26 may be formed to extend into substrate 24 in accordance with some embodiments. TSVs 26 are also sometimes referred as through-silicon vias when formed in a silicon substrate. Each of TSVs 26 may be encircled by an isolation liner (not shown), which is formed of a dielectric material such as silicon oxide, silicon nitride, or the like. The isolation liners isolate the respective TSVs 26 from semiconductor substrate 24. TSVs 26 and the isolation liners extend from the illustrated front surface of semiconductor substrate 24 to an intermediate level between the front surface and the back surface (the illustrated top surface) of semiconductor substrate 24. TSVs 26 may or may not extend into the dielectric layers in interconnect structure 30.

Interconnect structure 30 is formed underlying semiconductor substrate 24. Interconnect structure 30 may include a plurality of dielectrics layers 32. Metal lines and vias 36 are formed in dielectric layers 32, and are electrically connected to TSVs 26 and the circuits 23 in chip 22'. In accordance with some embodiments, dielectric layers 32 comprise silicon oxide, silicon nitride, silicon carbide, silicon oxynitride, combinations thereof, and/or multi-layers thereof. Dielectric layers 32 may comprise one or more Inter-Metal-Dielectric (IMD) layers formed of low-k dielectric materials having low k values, which may be, for example, lower than about 3.0, or in the range between about 2.5 and about 3.0.

Interconnect structure 30 further includes conductive features 40, which are sometimes referred to as Under-Bump-Metallurgies (UBMs). Conductive features 40 may be formed of non-solder materials, which may be formed of or comprise copper, titanium, nickel, multi-layers thereof, alloys thereof, and/or the like. Conductive features 40 may be electrically connected to integrated circuits 23 through metal lines and vias 36, and through some other conductive features (not shown) including, and not limited, aluminum pads, Post Passivation Interconnect (PPI), or the like. Also, between conductive features 40 and metal lines and vias 36, there may be dielectric layers such as low-k dielectric layers, passivation (non-low-k) layers, polymer layers, or the like.

Conductive features 40 are formed in dielectric layer 41. In accordance with some embodiments, dielectric layer 41 is formed of or comprises a polymer, which may be polyimide, polybenzoxazole (PBO), or the like. Dielectric layer 42 may further be formed on dielectric layer 41, and is formed as a surface layer of wafer 22. In accordance with some embodiments of the present disclosure, dielectric layer 42 is formed of or comprises a silicon-containing dielectric material, which may or may not include oxygen. For example, dielectric layer 42 may comprise silicon oxide, silicon nitride, silicon oxynitride, or the like.

Throughout the description, the side of semiconductor substrate 24 having the circuits 23 and interconnect structure 30 is referred to as a front side (or active side) of semiconductor substrate 24, and the opposite side is referred to as a backside (or inactive side) of semiconductor substrate 24. Also, the backside of semiconductor substrate 24 is also referred to as the backside (or inactive side) of the corresponding chip 22' (and wafer 22), and the opposing side is referred to as the front side (or active side) of chip 22' (and wafer 22). Accordingly, in FIG. 1B, the back side of wafer 22 and chips 22' is the side facing up.

Figure 2B:
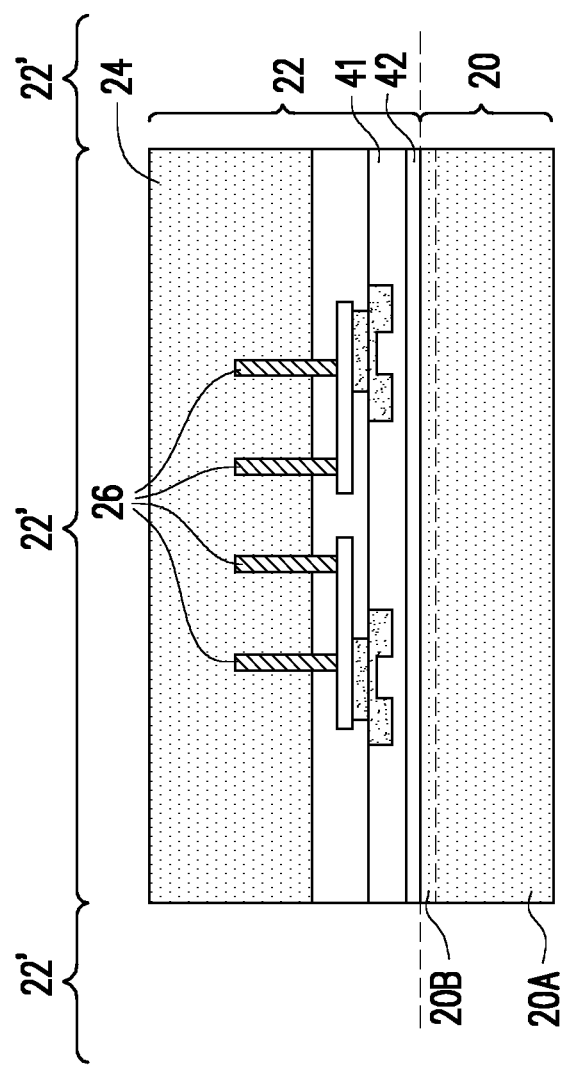
Figure 2A:
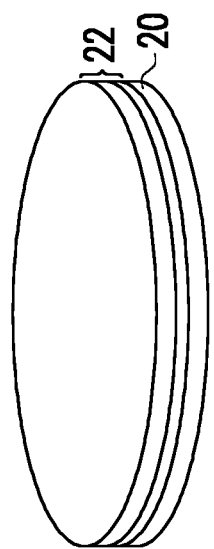
Figure 27:
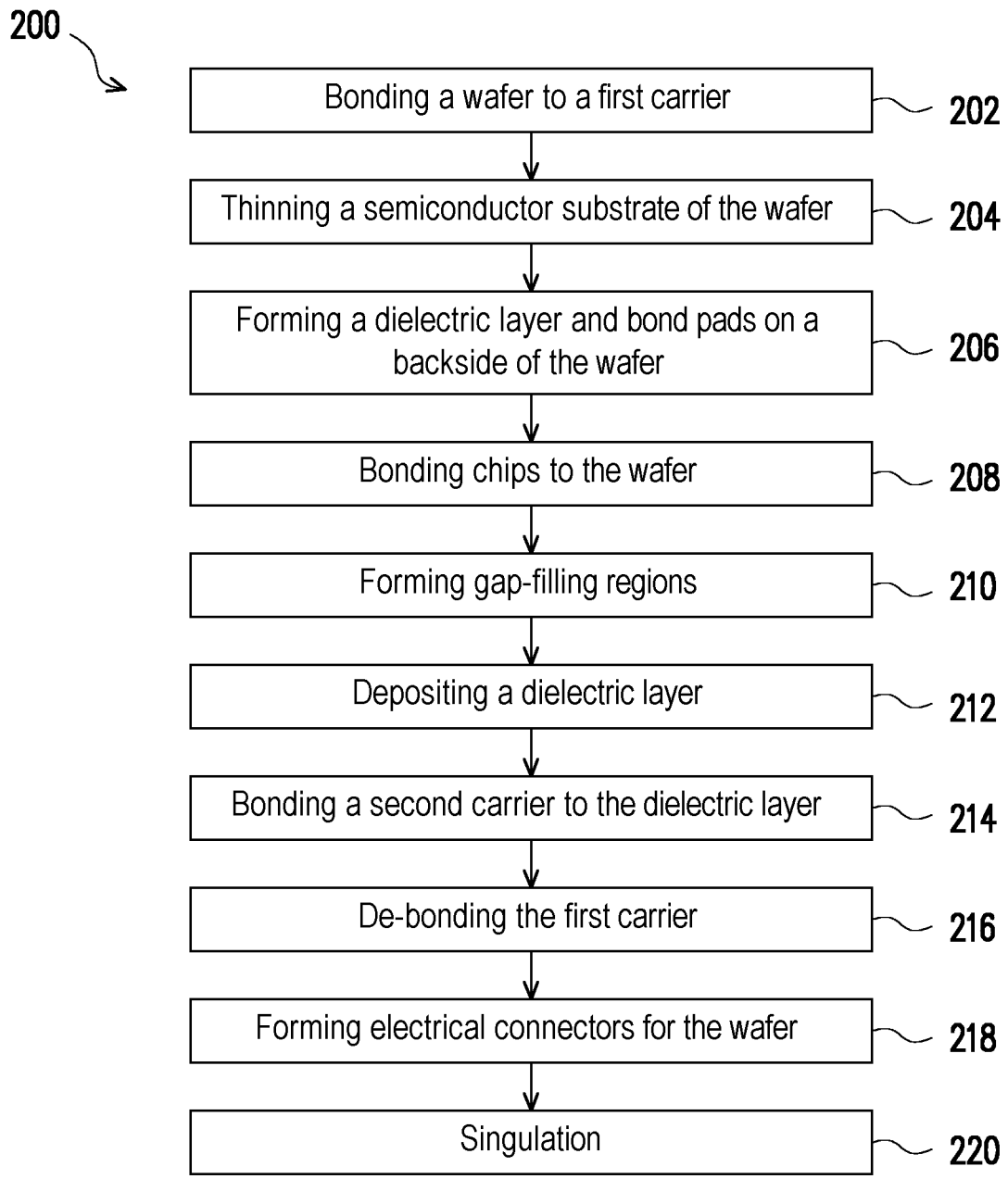
FIG. 27 illustrates a process flow for forming a chip stack in accordance with some embodiments.

FIGS. 2A and 2B illustrate a perspective view and a cross-sectional view, respectively, of the bonding of carrier 20 with wafer 22. The respective process is illustrated as process 202 in the process flow 200 as shown in FIG. 27. The bonding is through direct wafer bonding, wherein the smooth, flat and clean surfaces of carrier 20 and wafer 22 are bonded to each other. In accordance with some embodiments, the bonding is through fusion bonding. For example, Si—O—Si bonds may be formed, with Si—O bond being from one of carrier 20 and wafer 22, and Si atom being from the other one of carrier 20 and wafer 22.

In accordance with alternative embodiments, instead of fusion bonding, carrier 20 may be attached to wafer 22 through a Light-To-Heat-Conversion (LTHC) film.

Figure 3:
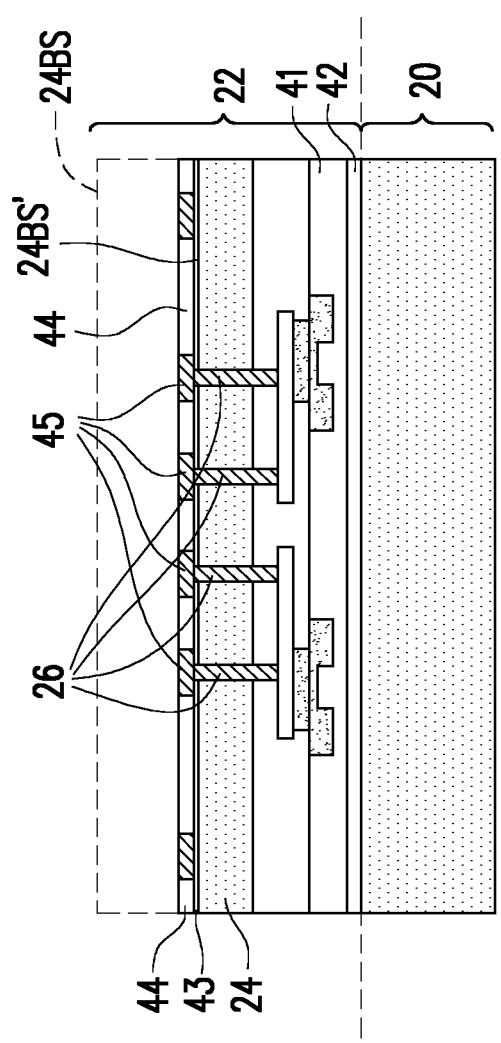

FIG. 3 illustrates a plurality of processes, which include the thinning of substrate 24. For example, a Chemical Mechanical Polish (CMP) process or a mechanical grinding process may be performed to polish the back surface 24BS, and generate retreated back surface 24BS'. The respective process is illustrated as process 204 in the process flow 200 as shown in FIG. 27. Semiconductor substrate 24 is then recessed through etching, so that TSVs 26 protrude higher than the resulting recessed back surface 24BS'. Dielectric layer 43 is then deposited, followed by a planarization process such as a CMP process or a mechanical polishing process so that the top surfaces of TSVs 26 and the top surface of dielectric layer 43 are coplanar, or the top surfaces of TSVs 26 are slightly taller than the top surface of dielectric layer 43. Next, dielectric layer 44 and bond pads 45 may be formed, which have coplanar top surfaces or the bond pads 45 are slightly taller than the dielectric layer 44. The respective process is illustrated as process 206 in the process flow 200 as shown in FIG. 27. In accordance with some embodiments, bond pads 45 are formed of or comprise copper. Dielectric layer 44 is formed of a dielectric material that is suitable for fusion bonding, which may be formed of or comprise silicon oxide, silicon nitride, silicon oxynitride, or the like.

Figure 4A:
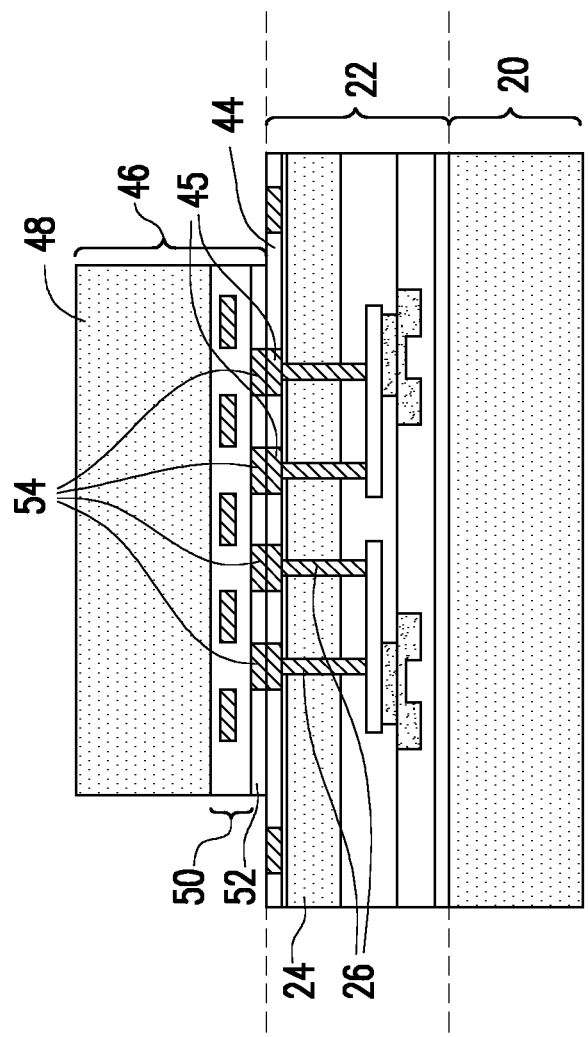
Figure 4B:
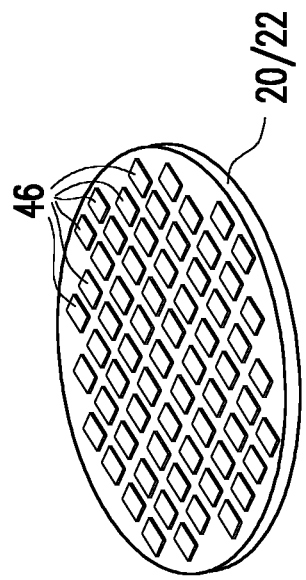

Referring to FIGS. 4A and 4B, chips 46 are bonded to wafer 22. The respective process is illustrated as process 208 in the process flow 200 as shown in FIG. 27. Although one chip 46 is illustrated in FIG. 4A, a plurality of chips 46 (FIG. 4B) are bonded to the device chips 22' in wafer 22, for example, through face-to-back bonding, with the front sides (faces) of chips 46 facing the back of wafer 22. There may be a single or a plurality of chips 46 bonded to the same chip 22'. Chips 46 may include semiconductor substrate 48, interconnect structure 50, dielectric layer 52, and bond pads 54. The bonding of chips 46 to wafer 22 may be achieved through hybrid bonding. In the hybrid bonding, bond pads 54 are bonded to bond pads 45 through metal-to-metal direct bonding. In accordance with some embodiments of the present disclosure, the metal-to-metal direct bonding comprises copper-to-copper direct bonding. Furthermore, surface dielectric layer 52 is bonded to surface dielectric layer 44 through dielectric-to-dielectric bonding, which may be fusion bonding. For example, Si—O—Si bonds may be generated, with Si—O bonds being in a first one of dielectric layers 52 and 44, and Si atoms being in a second one of dielectric layers 52 and 44.

In accordance with some embodiments, wafer 22 is manufactured using more mature (which may be older) technology, so that the yield is high. Otherwise, if any of the chips 22' in wafer 20 is defective, all chips bonding to it will be wasted. On the other hand, when more demanding performance is required, and the corresponding chips are manufactured using a more recent technology that has a lower yield, the corresponding chips may adopt die-form, so that known-good-dies 46 are used, while defective chips are discarded. For example, wafer 22 may be formed of 10 nm technology or older, while chips 46 may be manufactured using 7 nm technology or newer. The critical dimensions (the widths of the gates of) of the transistors in chips 46 are accordingly smaller than the critical dimensions of the transistors in wafer 22. For example, the critical dimension of the transistors in wafer 22 may be 10 nm or wider, and the critical dimension of the transistors in Chips 46 may be 7 nm or narrower.

To achieve the hybrid bonding, a pre-bonding is performed by lightly pressing chips 46 against wafer 22. After all chips 46 are pre-bonded, an annealing process is performed to cause the inter-diffusion of the metals in bond pads 45 and the corresponding overlying bond pads 54. The annealing temperature may be higher than about 350° C., and may be in the range between about 350° and about 550° C. in accordance with some embodiments. The annealing time may be in the range between about 1.5 hours and about 3.0 hours, and may be in the range between about 1.0 hour and about 2.5 hours in accordance with some embodiments. Through the hybrid bonding, bond pads 54 are bonded to the corresponding bond pads 45 through direct metal bonding caused by metal inter-diffusion.

In accordance with some embodiments, after the bonding process, a backside grinding process is performed to thin chips 46. Through the thinning of chips 46, the aspect ratio of the gaps between neighboring chips 46 is reduced in order to reduce the difficulty in the subsequent gap-filling process. In accordance with alternative embodiments, the thinning process is skipped.

Figure 5:
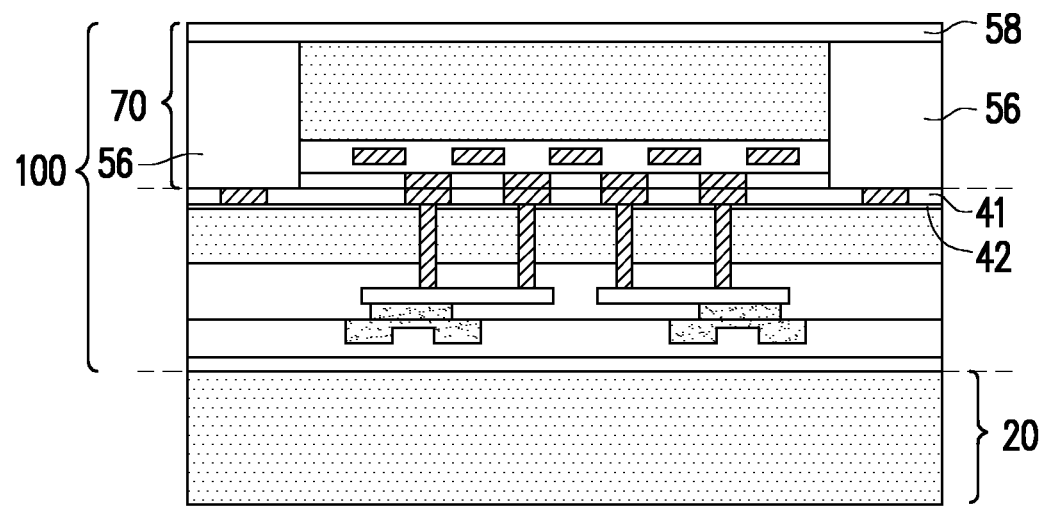

FIG. 5 illustrates a gap-filling process, in which gap-filling regions 56 are formed to fill the gaps between neighboring chips 46. The respective process is illustrated as process 210 in the process flow 200 as shown in FIG. 27. In accordance with some embodiments, the gap-filling process includes depositing a dielectric liner (which acts as an adhesion layer), and depositing a filling-material. In accordance with some embodiments of the present disclosure, the dielectric liner is formed of a nitride-containing material such as silicon nitride. The dielectric liner may be a conformal layer. The deposition may be achieved through a conformal deposition process such as Atomic Layer Deposition (ALD) or Chemical Vapor Deposition (CVD). The filling-material is different from the material of the dielectric liner. In accordance with some embodiments of the present disclosure, the filling-material is formed of silicon oxide, while other dielectric materials such as silicon oxynitride, silicon oxy-carbo-nitride, Phospho-silicate-Glass (PSG), Boro-silicate-Glass (BSG), Boro-Phospho-silicate-Glass (BPSG), or the like may also be used. The filling-material may be formed using CVD, High-Density Plasma Chemical Vapor Deposition (HDPCVD), Flowable CVD, spin-on coating, or the like. In accordance with alternative embodiments, gap-filling regions 56 are formed of or comprise an encapsulant, which may be formed of molding compound, molding underfill, a resin, an epoxy, a polymer, and/or the like.

A planarization process such as a CMP process or a mechanical grinding process is then performed to remove excess portions of the gap-filling material, so that chips 46 are exposed. The remaining portions of the gap-filling material are gap-filling regions 56.

Next, as also shown in FIG. 5, dielectric layer 58 is deposited as a planar layer. The respective process is illustrated as process 212 in the process flow 200 as shown in FIG. 27. In accordance with some embodiments, dielectric layer 58 comprises silicon oxide, silicon nitride, silicon oxynitride or the like. Throughout the description, the structure formed in preceding processes is referred to as reconstructed wafer 100. Chips 46, gap-filling regions 56, and dielectric layer 58 are collectively referred to as reconstructed wafer 70.

Figure 6:
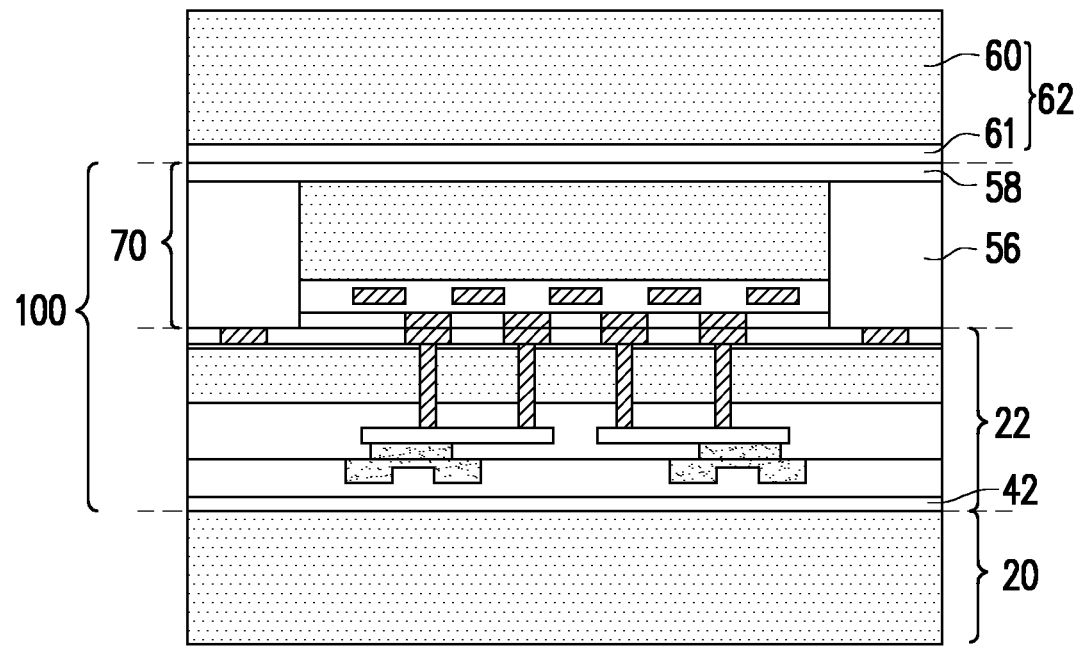

FIG. 6 illustrates the bonding of carrier 62 to reconstructed wafer 100. The respective process is illustrated as process 214 in the process flow 200 as shown in FIG. 27. Carrier 62 may have a structure selected from the same candidate structures of carrier 20, and may have the same structure (same materials) as, or a different structure from, carrier 20. For example, carrier 62 may have base layer 60 and surface layer 61. The base layer 60 may be a silicon layer (such as crystalline silicon), glass, or other types of semiconductor or dielectric materials. The surface layer 61 may be a silicon-containing layer (such as an amorphous or polycrystalline silicon layer) or a silicon-oxide containing layer. The bonding of carrier 62 to reconstructed wafer 100 may include fusion bonding, for example, with Si—O—Si bonds formed to join dielectric layers 58 and 61.

Figure 7:
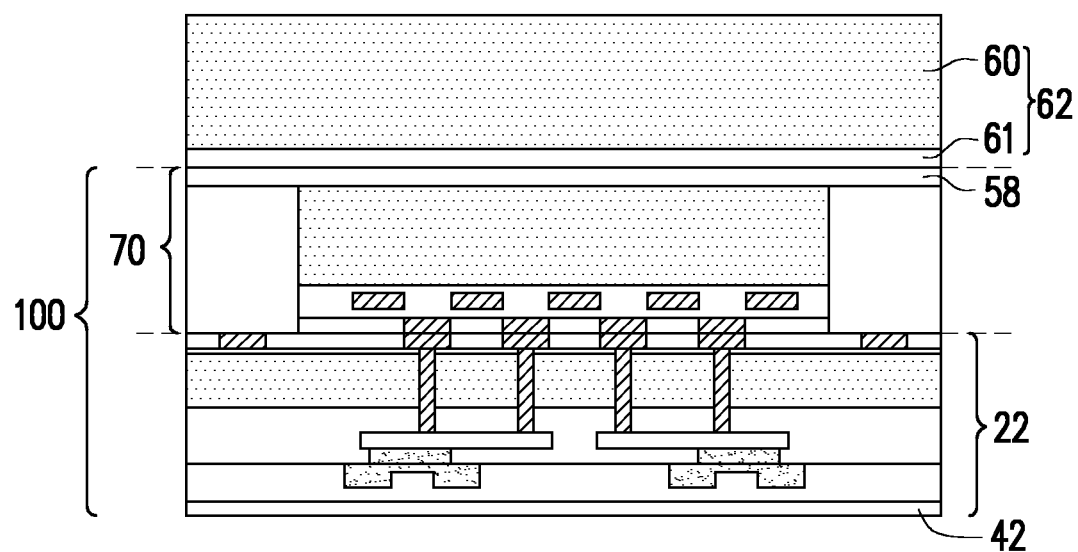

Next, carrier 20 is de-bonded from the overlying structure, and the resulting reconstructed wafer 100 is shown in FIG. 7. The respective process is illustrated as process 216 in the process flow 200 as shown in FIG. 27. When fusion bonding is formed between wafer 22 and carrier 20, the de-bonding may be achieved, for example, by conducting hydrogen and applying a force to break the bonds. In accordance with other embodiments in which the LTHC is adopted, a radiation such as a laser beam may be used to break down the LTHC.

Figure 8:
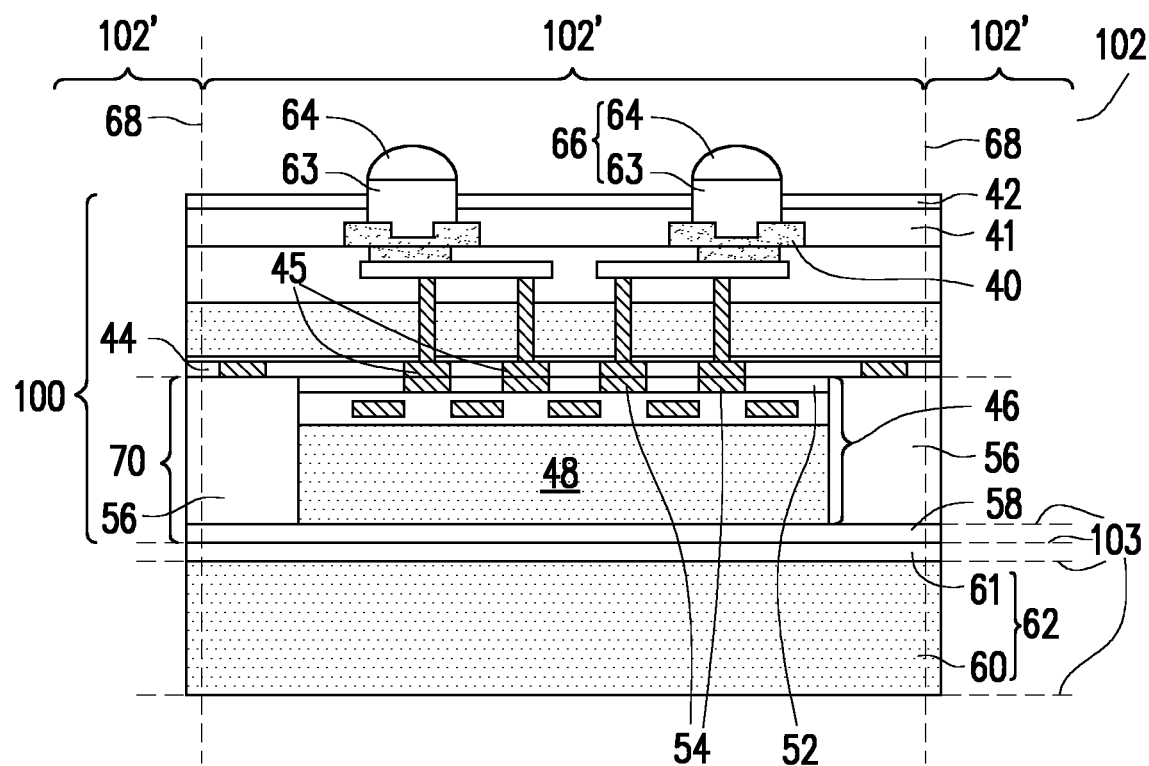

FIG. 8 illustrates the formation of electrical connectors 66. The respective process is illustrated as process 218 in the process flow 200 as shown in FIG. 27. For example, a mask (such as a photo resist) may be formed and patterned, and some portions of dielectric layers 41 and 42 are removed through etching, revealing conductive features 40. Electrical connectors 66 may then be formed through plating. Electrical connectors 66 may include metal pillars 63 and solder regions 64. The resulting structure is referred to as reconstructed wafer 102.

In accordance with some embodiments, reconstructed wafer 102 is thinned by removing carrier 62 from the underlying structure. In accordance with alternative embodiments, carrier 62 is left in the final structure. The resulting structure is also referred to as reconstructed wafer 102. Dielectric layer 61 may be or may not be removed from reconstructed wafer 102. Dielectric layer 58 also may be or may not be removed from reconstructed wafer 102. Alternatively stated, the bottom surface of the reconstructed wafer 102 (and packages 102') may be at any of the levels shown as dashed lines 103, and the portions under the corresponding dashed line 103 are removed.

Reconstructed wafer 102 is then singulated (through sawing, for example) along scribe lines 68 to form a plurality of identical packages 102'. The respective process is illustrated as process 220 in the process flow 200 as shown in FIG. 27. Each of packages 102' includes gap-filling regions 56 and chips 46, and may or may not include the features underlying gap-filling regions 56 and chips 46. In a package 102', chips 22' and 46 are stacked. Package 102' may then be bonded to another package component (not shown) such as a package substrate, a printed circuit board, or the like. An underfill may be dispensed between chip 102' and the bonding package component.

In conventional structures in which packages are formed of stacked chips, a plurality of first-tier chips are picked-and-placed on a carrier, followed by a gap-filling process. A plurality of second-tier chips are then picked-and-placed on a carrier, followed by another gap-filling process. The picking-and-placing of chips for each of the tiers is time consuming and costly. Furthermore, if through-vias are to be formed in the first tier, the through-vias may be located in the gap-filling regions. In the present disclosure, wafer 22 is adopted, and chips 46 are picked-and-placed on wafer 22. This saves the time and the cost for picking-and-placing chips 22'. As a result of using the wafer-form, TSVs 26 are formed in semiconductor substrate 24, rather than in gap-filling regions.

Figure 9:
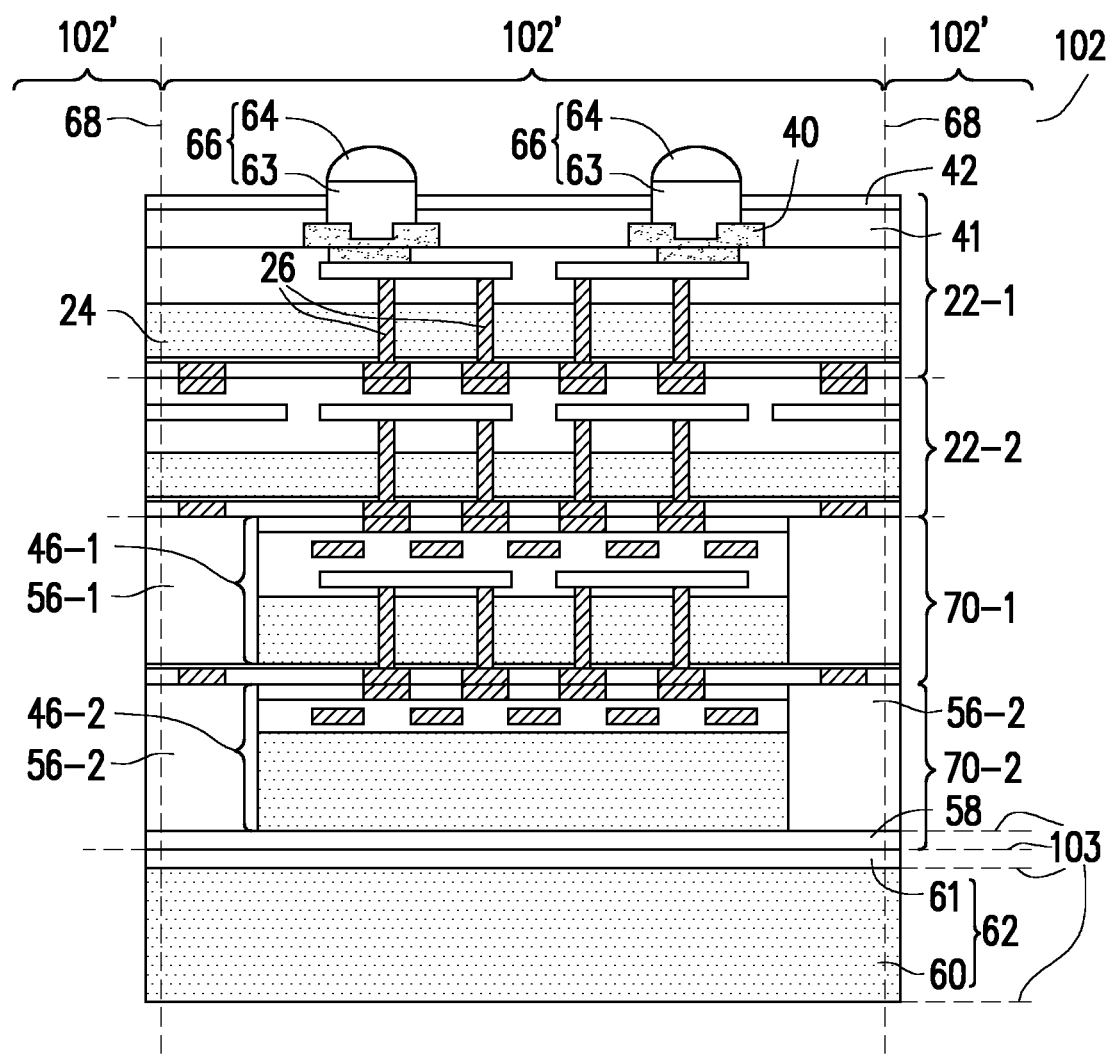
FIGS. 9 and 10 illustrate the cross-sectional views of some chip stacks in accordance with some embodiments.
Figure 10:
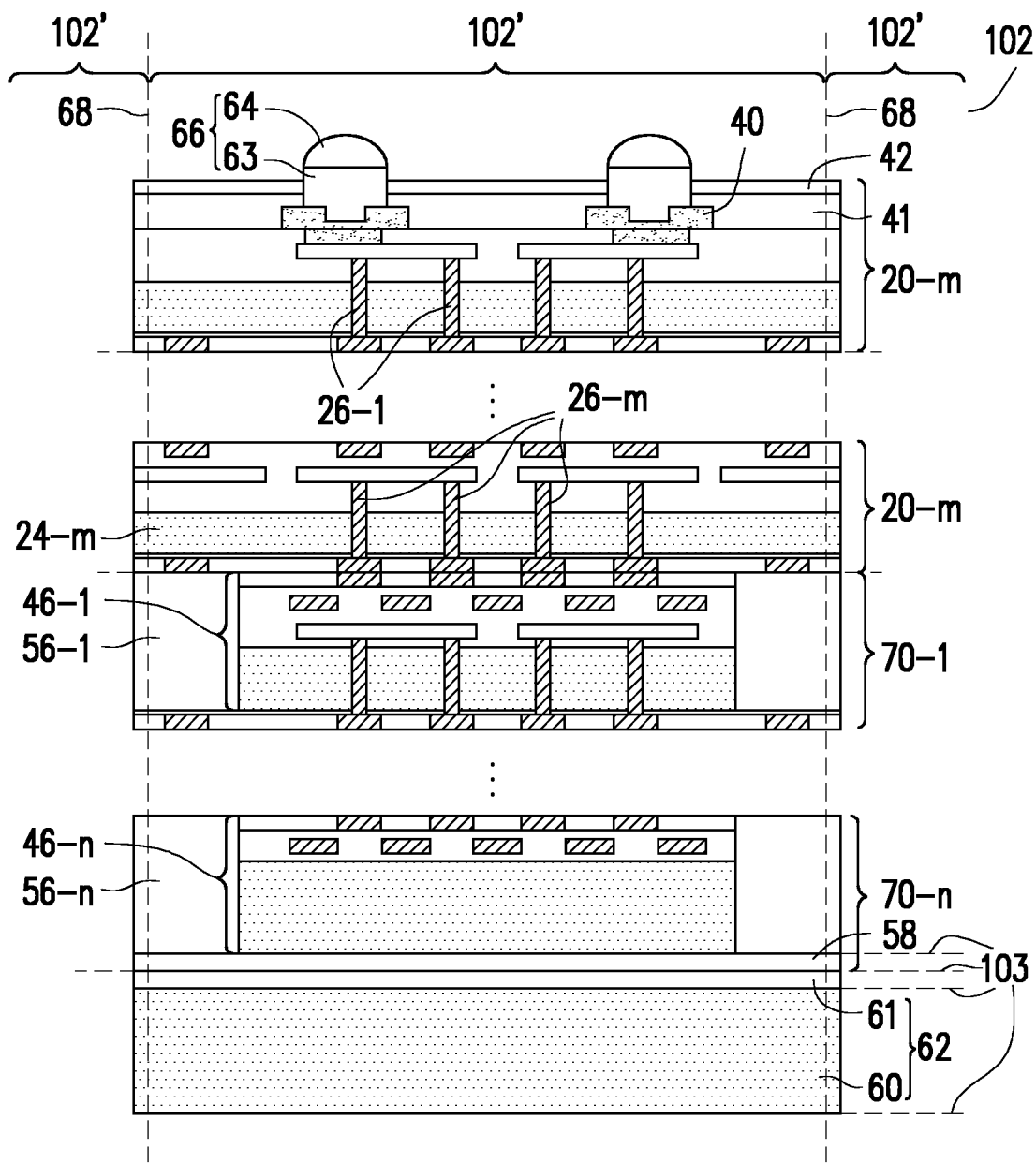

FIGS. 9 and 10 illustrate the packages including stacked dies in accordance with some embodiments. These embodiments are similar to the embodiments shown in FIGS. 1 through 8, except more tiers of wafers and chips are bonded. The formation processes thus include the processes shown in FIGS. 1 through 8, except the formation processes of the additional tiers are added. FIG. 9 illustrates the cross-sectional view of reconstructed wafer 102 and the singulated packages 102' in accordance with some embodiments. In subsequent discussion, like features may be denoted with a "-" sign followed by a number to distinguish the tiers of the corresponding wafers and chips. For example, a first-tier wafer and a second-tier wafer may be referred to as wafer 22-1 and wafer 22-2, respectively, and a first-tier chip and a second-tier chip may be referred to as chip 46-1 and chip 46-2, respectively. The reconstructed wafer 102 includes wafer 22-1, and wafer 22-2 underlying and bonding to wafer 22-1 through hybrid bonding. For example the face of wafer 22-2 is bonded to the back of wafer 22-1 through face-to-back bonding. Chips 46-1 and gap-fill regions 56-1 are underlying and bonding to wafer 22-2 to form reconstructed wafer 70-1. The bonding may be face-to-back bonding, with the faces of chips 46-1 bonding to the back of wafer 22-2. Chips 46-2 and gap-fill regions 56-2 are underlying and bonding to reconstructed wafer 70-1 to form reconstructed wafer 70-2. The bonding may be face-to-back bonding, with the faces of chips 46-2 bonding to the back of chips 46-1. The formation of reconstructed wafers 70-1 and 70-2 may be similar to the formation of reconstructed wafer 70 as shown in FIG. 7. The rest of the processes may be realized by referring to the processes shown in FIGS. 1 through 8. The bonding between wafer 22-1 and 22-2, between wafer 22-2 and reconstructed wafer 70-1, and between reconstructed wafers 70-1 and 70-2 may be hybrid bonding. In the resulting reconstructed wafer 102 and packages 102', dielectric layers 61 and 58 and carrier 62 may be or may not be removed from reconstructed wafer 102 and packages 102'. The corresponding bottom level of the resulting packages 102' may be at any of the dashed lines 103.

FIG. 10 illustrates the cross-sectional view of reconstructed wafer 102 and the singulated packages 102' in accordance with some embodiments. These embodiments are similar to the embodiments shown in FIG. 9, except that there may be more tiers of wafers 22 (including 22-1 through 22-m) and reconstructed wafers 70 (including 70-1 through 70-n). In accordance with some embodiments, each of integers m and n may be any integer greater than 2, such as 3, 4, 5, or greater. The formation process may be realized by referring to the discussions of the preceding embodiments. The formation of the packages shown in FIGS. 9 and 10 are similar to what are shown in preceding figures, which includes the bonding of carriers 20 and 62.

FIGS. 11 through 16 illustrate the cross-sectional views of intermediate stages in the formation of a package in accordance with alternative embodiments of the present disclosure. These embodiments are similar to the preceding embodiments, except that instead of bonding wafer 22 to carrier 20, two wafers (22-1 and 22-2) are bonded together. Unless specified otherwise, the materials and the formation processes of the components in these embodiments are essentially the same as the like components, which are denoted by like reference numerals in the preceding embodiments. The details regarding the formation processes and the materials of the components shown in FIGS. 11 through 16 (and FIGS. 17-26) may thus be found in the discussion of the preceding embodiments.

Figure 11:
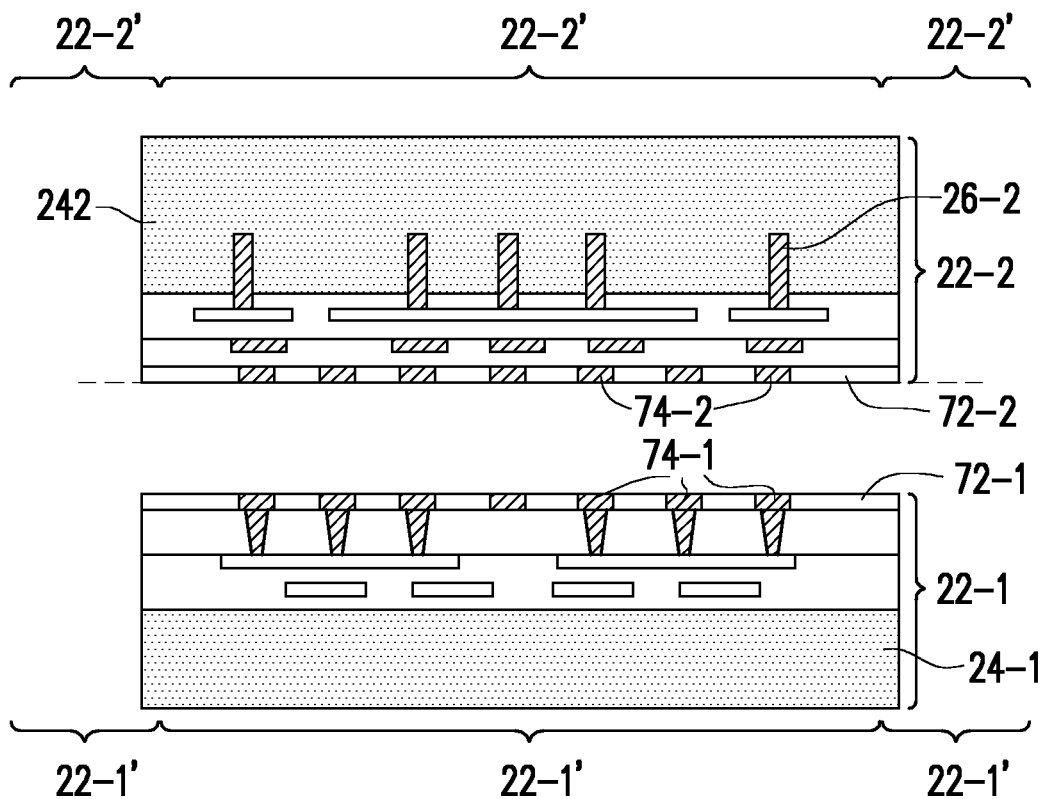
FIGS. 11 through 16 illustrate the cross-sectional views of intermediate stages in the formation of a chip stack in accordance with some embodiments.

Referring to FIG. 11, wafer 22-2 is bonded to wafer 22-1 through face-to-face and wafer-to-wafer bonding. Each of the wafers 22-1 and 22-2 may have a structure similar to what has been discussed referring to FIG. 1B, and the details are not repeated herein. The bonding is performed through hybrid bonding, with bond pads 74-1 bonded to bond pads 74-2 through metal-to-metal direct bonding, and surface dielectric layer 72-1 being bonded to surface dielectric layer 72-2 through dielectric-to-dielectric bonding. The resulting bonded wafers are illustrated in FIG. 12.

Figure 12:
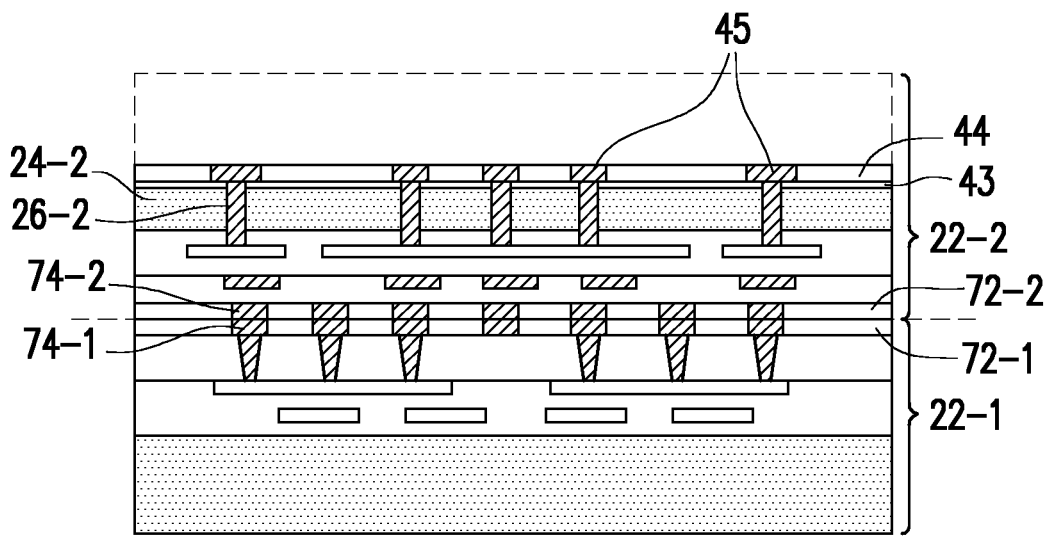
Figure 13:
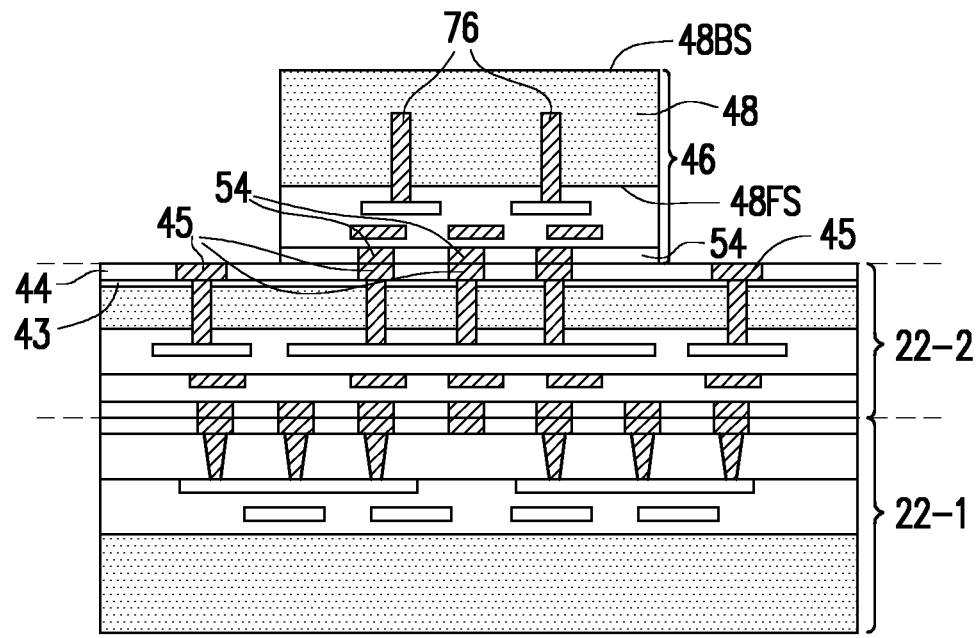

FIG. 12 further illustrates the thinning of semiconductor substrate 24, and the formation of dielectric layers 43 and 44, and bond pads 45. Next, referring to FIG. 13, chips 46 are bonded to wafer 22-2 through chip-on-wafer bonding. In accordance with some embodiments, the bonding is a face-to-back bonding. The details of the bonding may be found referring to FIGS. 4A and 4B. In accordance with some embodiments, chip 46 includes through-vias (TSVs) 76 extending to an intermediate level between the front surface 48FS and the back surface 48BS of semiconductor substrate 48.

Figure 14:
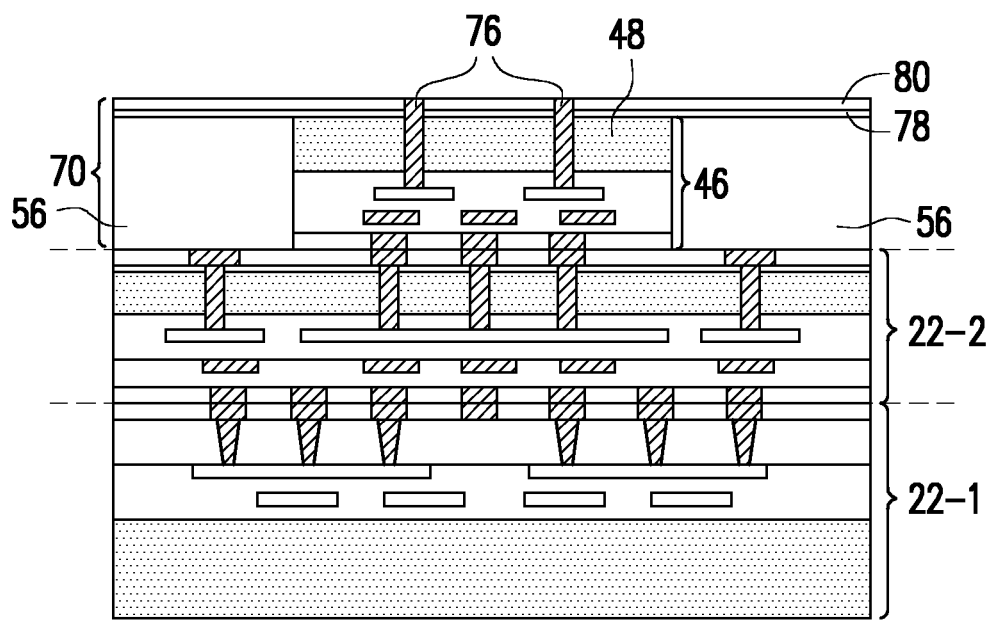

FIG. 14 illustrates the filling and the planarization of a dielectric material(s) to form gap-filling regions 56. The planarization process is performed until through-vias 76 are exposed. Next, semiconductor substrate 48 is recessed, so that through-vias 76 protrude out of the back surface of semiconductor substrate 48. Next, dielectric layers 78 and 80 are formed. Each of dielectric layers 78 and 80 may be formed of silicon oxide, silicon nitride, silicon oxynitride, or the like. In accordance with some embodiments, when semiconductor substrate 48 is recessed, gap-filling regions 56 are not recessed. Accordingly, dielectric layer 78 is formed in the recess of gap-filling regions 56, and the top surface of dielectric layer 78 is coplanar with the top surfaces of gap-filling regions 56. The sidewalls of dielectric layer 78 are thus flush with the sidewalls of semiconductor substrate 48, and are in contact with the sidewalls of gap-filling regions 56. In accordance with alternative embodiments, both of the semiconductor substrate 48 and gap-filling regions 56 are recessed, as shown in FIG. 14. Accordingly, dielectric layer 78 extends directly over both of chips 46 and gap-filling regions 56. In accordance with these embodiments, the illustrated two dielectric layers 78 and 80 may also be replaced with a single dielectric layer. Reconstructed wafer 70 is thus formed.

Figure 15:
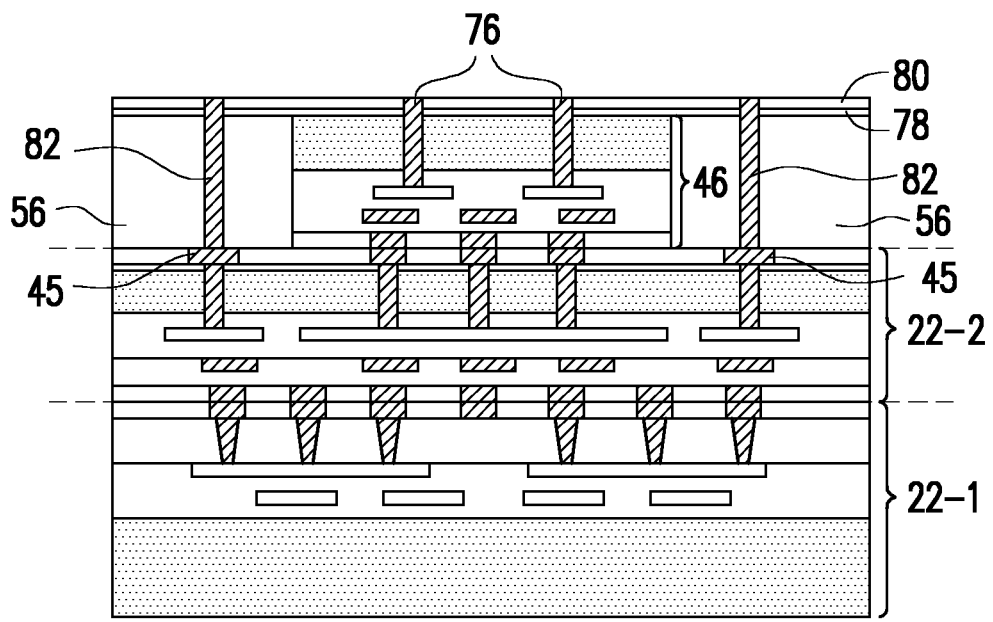

FIG. 15 illustrates the formation of through-vias 82, which are sometimes referred to as Through-Dielectric Vias (TDVs). The formation process may include etching gap-filling regions 56 to form via openings, with some conductive pads 45 revealed through the via openings. The via openings are then filled with a conductive material(s) such as tungsten, copper, aluminum, titanium, titanium nitride, or the like, multi-layers thereof, and/or combinations thereof. A planarization process such as a CMP process or a mechanical polishing process is then performed to remove excess portions of the conductive material, leaving through-vias 82.

Figure 16:
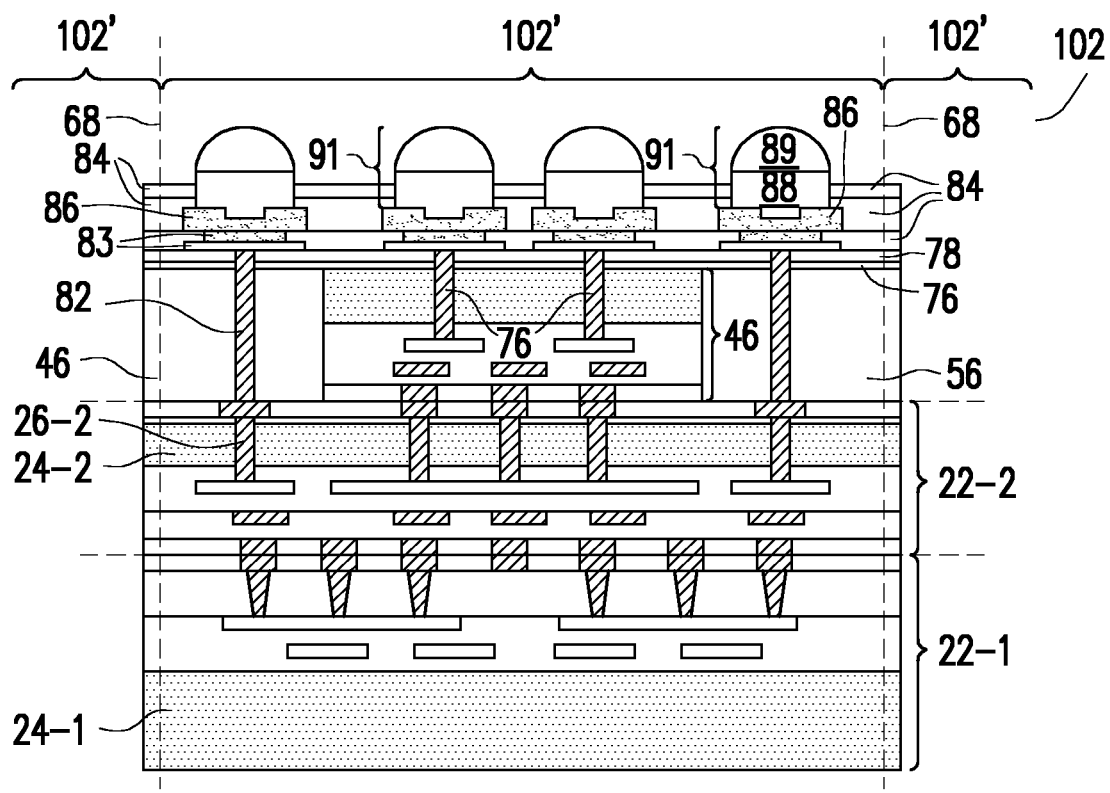

Referring to FIG. 16, redistribution lines (RDLs) 83, dielectric layers 84, UBMs 86, and electrical connectors 91 are formed. The materials and the formation processes of UBMs 86, dielectric layers 84, and electrical connectors 91 (including metal pillars 88 and solder regions 89) may be similar to that of UBMs 40, dielectric layers 41 and 42, and electrical connectors 66 as shown in FIG. 8. Reconstructed wafer 102 is thus formed. In accordance with some embodiments, reconstructed wafer 102 is thinned by thinning semiconductor substrate 24-1. In accordance with alternative embodiments, semiconductor substrate 24-1 is not thinned. Reconstructed wafer 102 is then singulated through scribe lines 68 to form a plurality of identical packages 102'.

Figure 17:
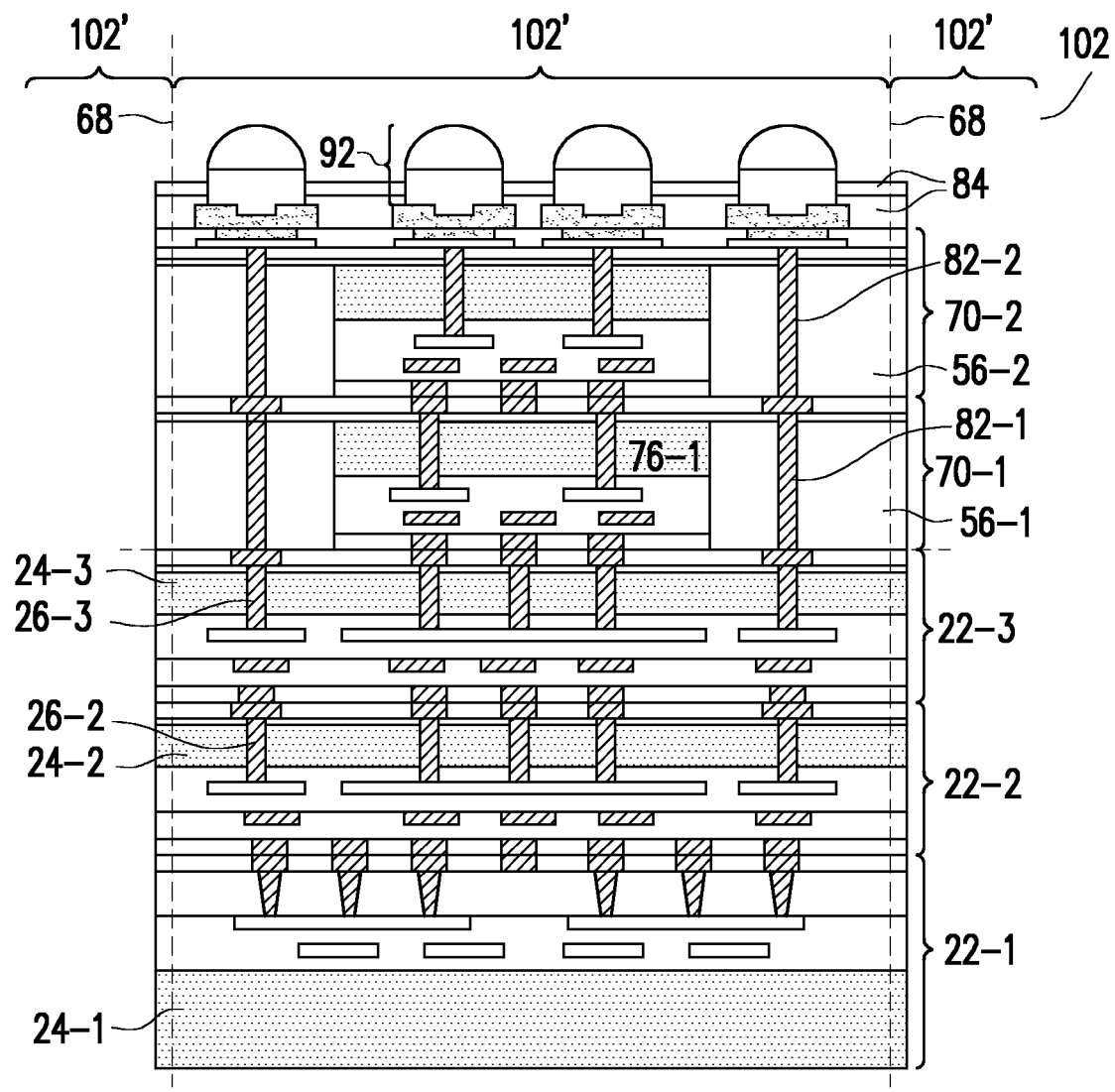
FIGS. 17 and 18 illustrate the cross-sectional views of some chip stacks in accordance with some embodiments.
Figure 18:
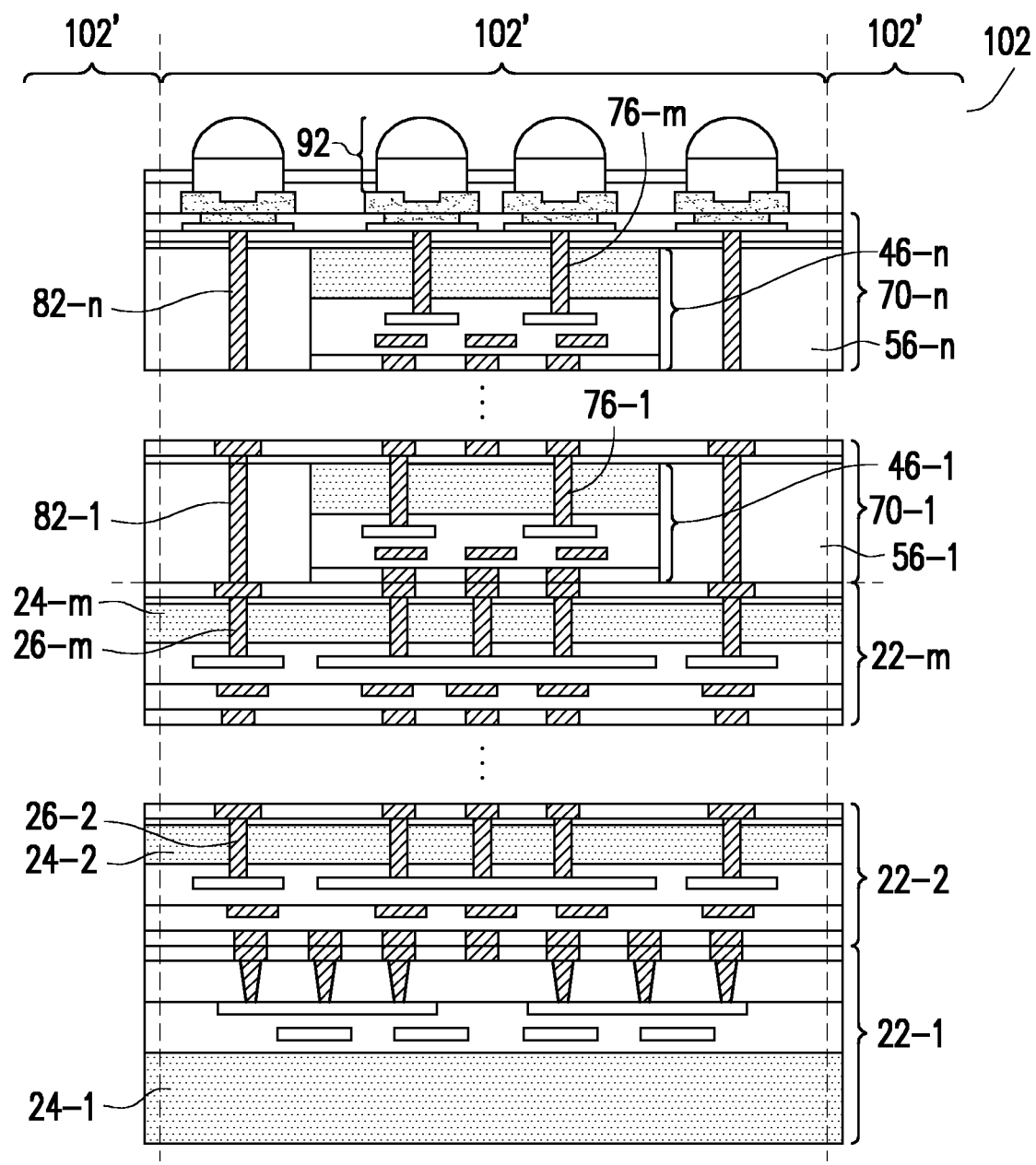

FIGS. 17 and 18 illustrate the packages including stacked dies in accordance with some embodiments. These embodiments are similar to the embodiments shown in FIGS. 1 through 8, except more tiers of wafers and chips are bonded. The formation processes thus include the processes shown in FIGS. 11 through 16, except the formation processes of the additional tiers are added. FIG. 17 illustrates wafer 102 and package 102' in accordance with alternative embodiments. These embodiments are similar to the embodiments shown in FIG. 16, except that an additional wafer 22-3 is bonded to wafer 22-2 through face-to-back bonding. Furthermore, instead of having one tier of reconstructed wafer 70, two tiers of reconstructed wafers 70-1 and 70-2 are formed, with chips 46-1 and 46-2 being encapsulated therein. Through-vias 82-1 and 82-2 are formed in the corresponding gap-filling regions 56-1 and 56-2, respectively. The bonding between reconstructed wafers 70-1 and 70-2, and between wafers 22-1, 22-2, and 22-3 may be hybrid bonding. The bonding between reconstructed wafers 70-1 and wafer 22-3 may also be hybrid bonding.

FIG. 18 illustrates wafer 102 and package 102' in accordance with yet alternative embodiments. These embodiments are similar to the embodiments shown in FIGS. 16 and 17, except that more wafers 22-1 through 22-*m* and more reconstructed wafers 70-1 through 70-*n* are adopted, wherein each of the integers m and n may be any integer greater than 2. The upper ones of wafers 22-1 through 22-*m* are bonded to the respective lower ones of wafers 22-1 through 22-*m* through wafer-to-wafer hybrid bonding. The upper ones of chips 46-1 through 46-*n* are bonded to the respective lower ones of reconstructed wafer 70-1 through 70-*n* through chip-on-wafer bonding. The formation processes of the structures shown in FIGS. 17 and 18 may be realized through the teaching in preceding embodiments.

FIGS. 19 through 24 illustrate the cross-sectional views of intermediate stages in the formation of a package in accordance with some embodiments of the present disclosure. These embodiments are similar to the preceding embodiments, except that instead of bonding wafer 22 to carrier 20, chips 46 are picked-and-placed on carrier 20, and encapsulated to form reconstructed wafer 70 first. Accordingly, with the reconstructed wafer 70 being pre-formed, reconstructed wafer 70 instead of discrete chips 46, is bonded to wafer 22.

Figure 19:
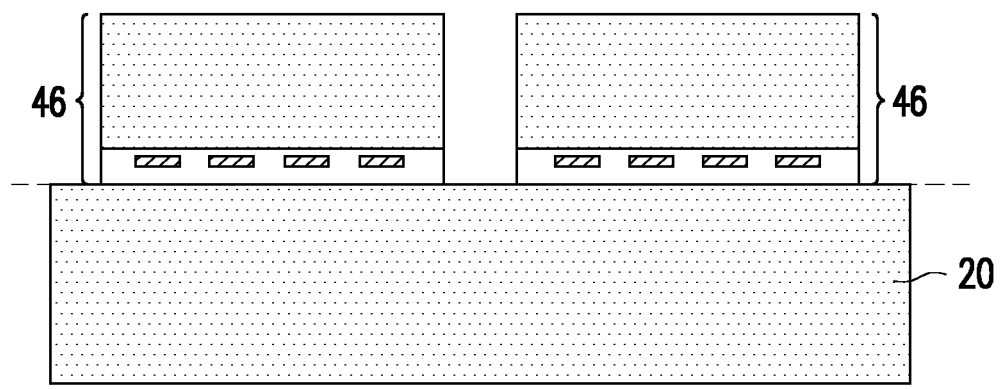
FIGS. 19 through 24 illustrate the cross-sectional views of intermediate stages in the formation of a chip stack in accordance with some embodiments.
Figure 20:
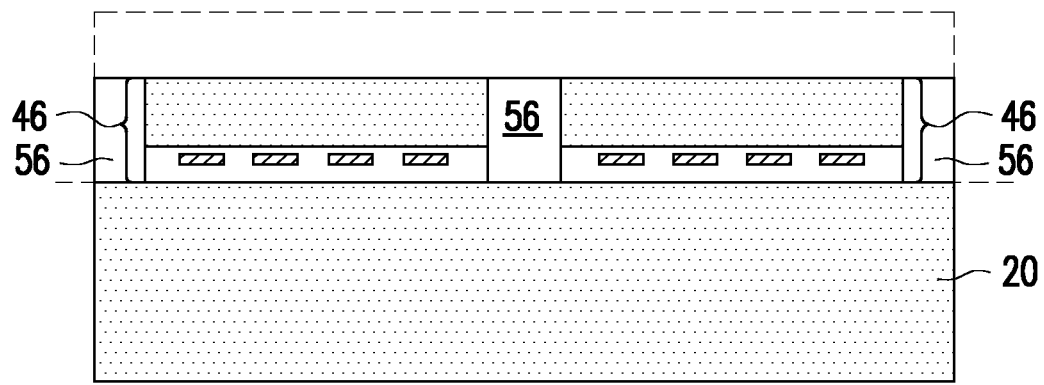
Figure 21:
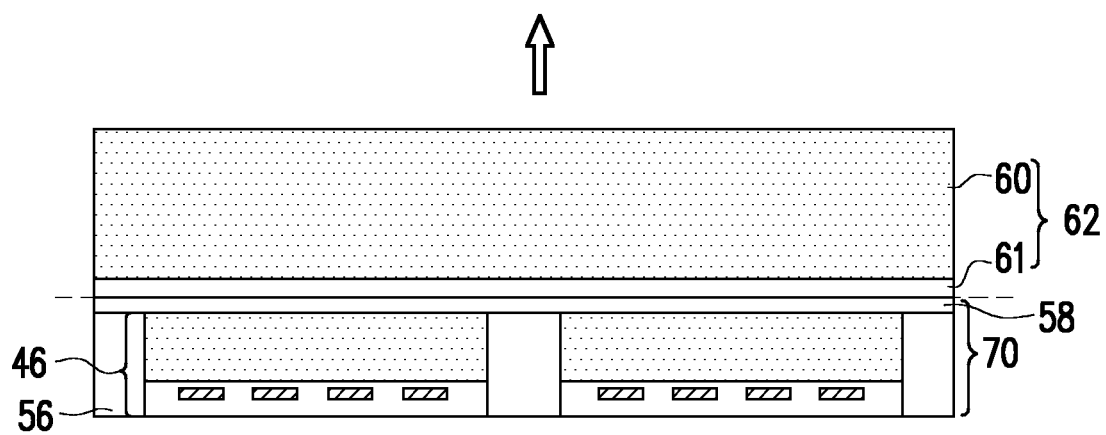
Figure 21:
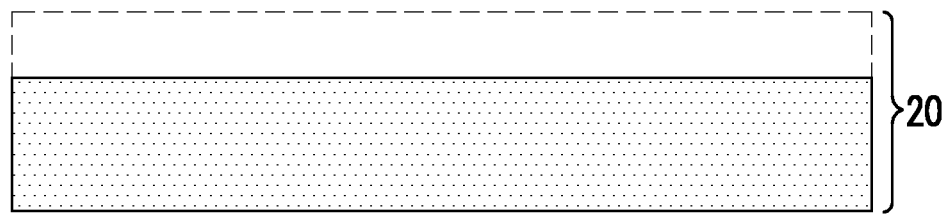

Referring to FIG. 19, chips 46 are bonded to carrier 20, for example, through fusion bonding. The front sides of chips 46 are bonded to carrier 20. FIG. 20 illustrates the formation of gap-filling regions 56, which involves filling a dielectric material(s)/layer(s), and then performing a planarization process. The planarization process is represented with dashed lines. Next, as shown in FIG. 21, dielectric layer 58 is deposited on chips 46 and gap-filling regions 56. In accordance with some embodiments, dielectric layer 58 comprises a silicon-containing dielectric material such as silicon oxide, silicon nitride, silicon oxynitride, or the like. Reconstructed wafer 70 is thus formed. Chips 46 may or may not be thinned before the gap-filling process. As also shown in FIG. 21, the previously formed reconstructed wafer 70 is bonded to carrier 62, for example, through fusion bonding. Dielectric layer 61 is bonded to dielectric layer 58 through fusion bonding, for example, with Si—O—Si bonds being formed. In a subsequent process, carrier 20 is de-bonded from reconstructed wafer 70. The front sides of chips 46 are thus revealed.

Figure 22:
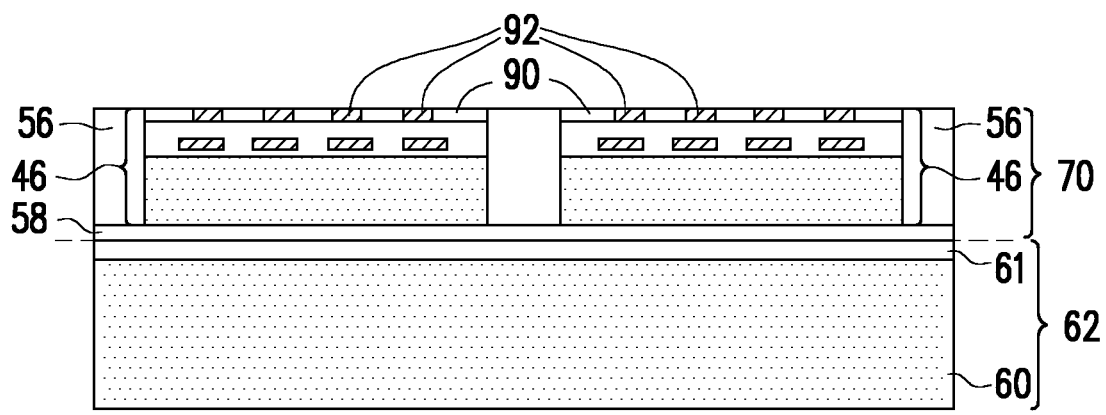

FIG. 22 illustrates the formation of bonding films, which include dielectric layers 90 and bond pads 92. In accordance with some embodiments, dielectric layers 90 are portions of chips 46 that are revealed after chips 46 are de-bonded from carrier 20. In accordance with alternative embodiments, there may be polymer protection layers in chips 46, which protection layers are revealed after chips 46 are de-bonded from carrier 20. The protection layers are then removed to form recesses, and dielectric layers 90 and bond pads 92 are formed in the recesses. Bond pads 92 are electrically connected to the devices in chips 46. Dielectric layers 90 may be formed of a silicon-containing dielectric material such as silicon oxide, silicon nitride, silicon oxynitride, or the like.

Figure 23:
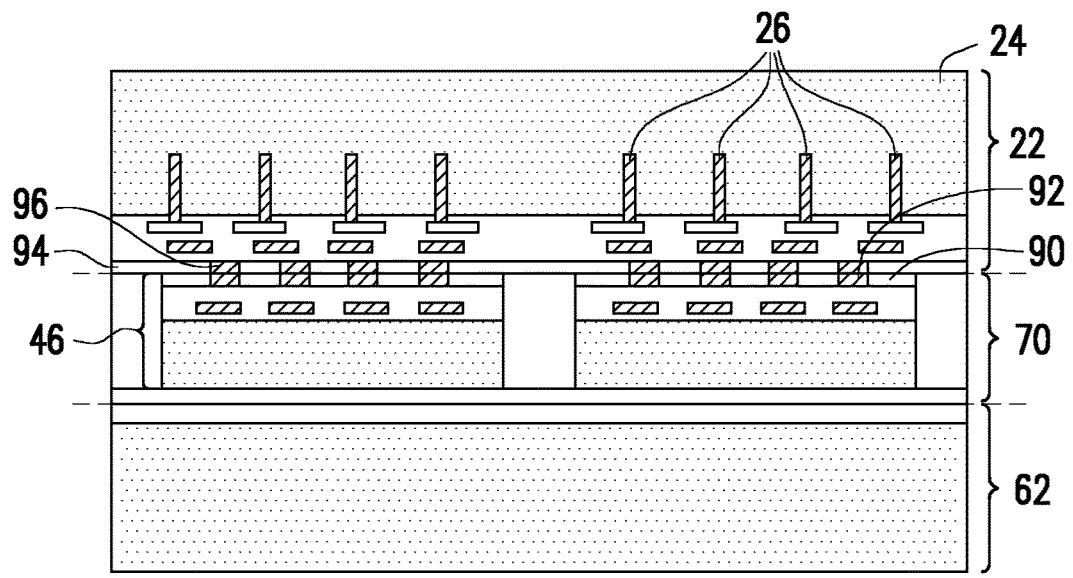

Referring to FIG. 23, wafer 22 is bonded to reconstructed wafer 70. Wafer 22 includes dielectric layer 94 and bond pads 96 in dielectric layer 94. The surfaces (the illustrated bottom surfaces) of dielectric layer 94 and bond pads 96 are coplanar. Wafer includes semiconductor substrate 24 and through-vias 26 extending into semiconductor substrate 24. In accordance with some embodiments, the bonding is through hybrid bonding, with bond pads 92 and 96 being bonded to each other through metal-to-metal bonding, and dielectric layers 90 and 94 bonded to each other through fusion bonding.

Figure 24:
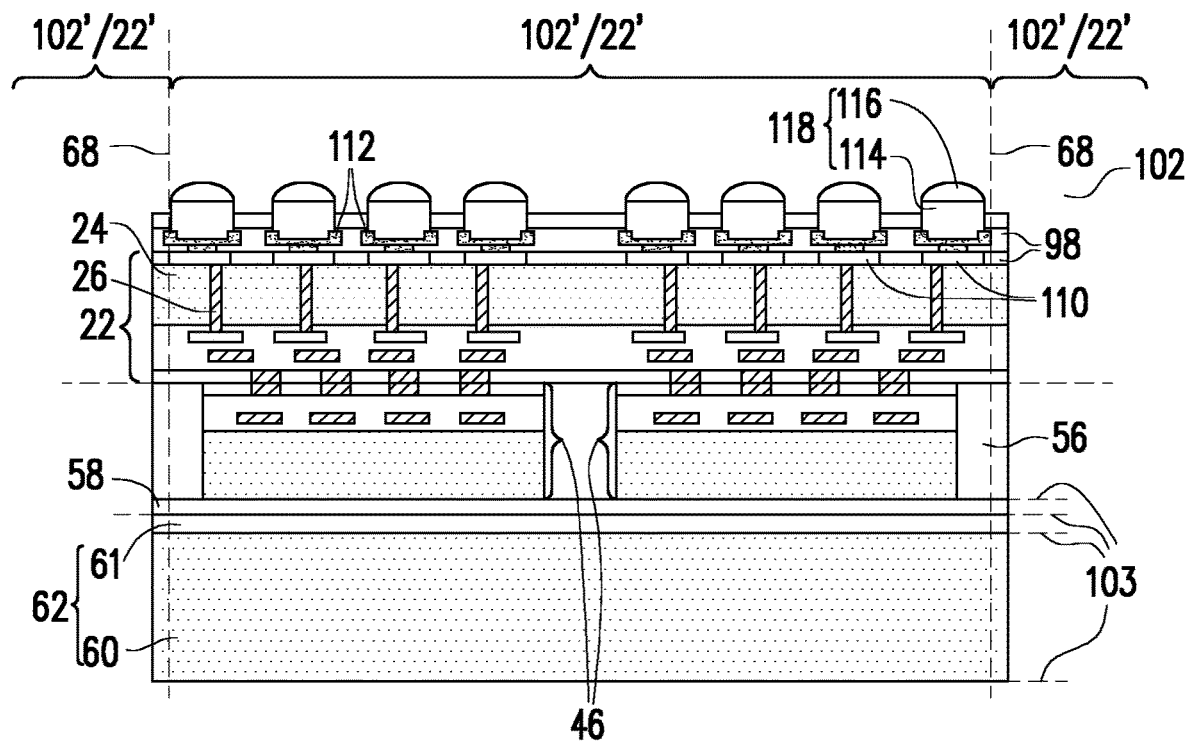

FIG. 24 illustrates the formation of a backside interconnect structure on the backside of wafer 22. The backside interconnect structure may include dielectric layers 98, metal pads 110 connected to through-vias 26, UBMs 112, and electrical connectors 118. Electrical connectors 118 may include metal pillars 114 and solder regions 116. The formation process of the interconnect structure may be realized through the teaching in the preceding embodiments. Reconstructed wafer 102 is thus formed.

In accordance with some embodiments, reconstructed wafer 102 is thinned by removing at least the base layer 60 of carrier 62 from the overlying structure. The resulting structure is also referred to as reconstructed wafer 102. Dielectric layer 61 may be or may not be removed from the reconstructed wafer 102. Dielectric layer 58 also may be or may not be removed from reconstructed wafer 102. Alternatively stated, the bottom surface of the remaining reconstructed wafer 102 may be at any of the levels shown as dashed lines 103, and the portions under the corresponding top surface are removed.

Reconstructed wafer 102 is then singulated through scribe lines 68 to form a plurality of identical packages 102'. Each of packages 102' includes gap-filling regions 56 and chips 46, and may or may not include the features underlying gap-filling regions 56 and chips 46. In a package 102', chips 22' and 46 are stacked.

Figure 25:
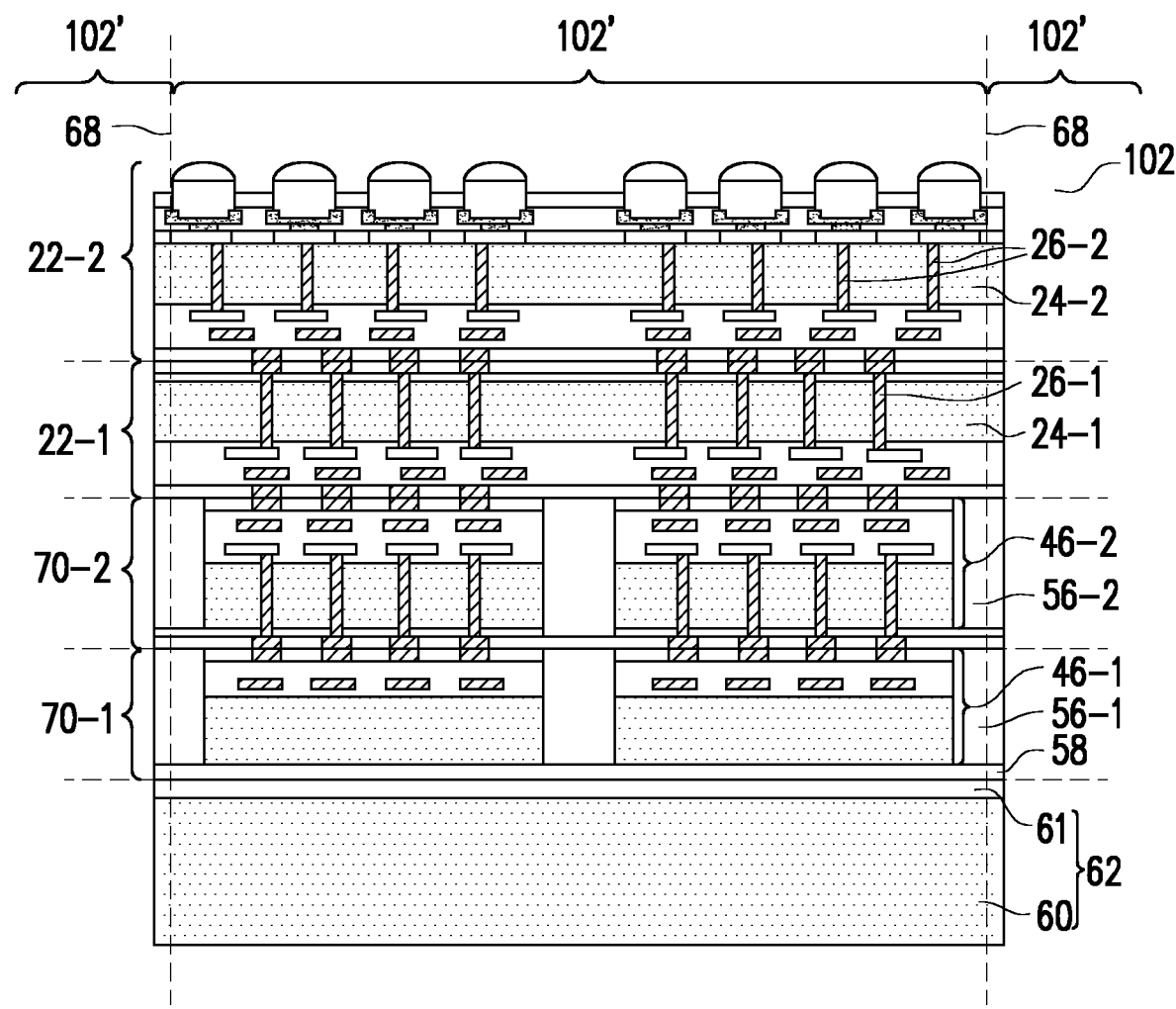
FIGS. 25 and 26 illustrate the cross-sectional views of some chip stacks in accordance with some embodiments.
Figure 26:
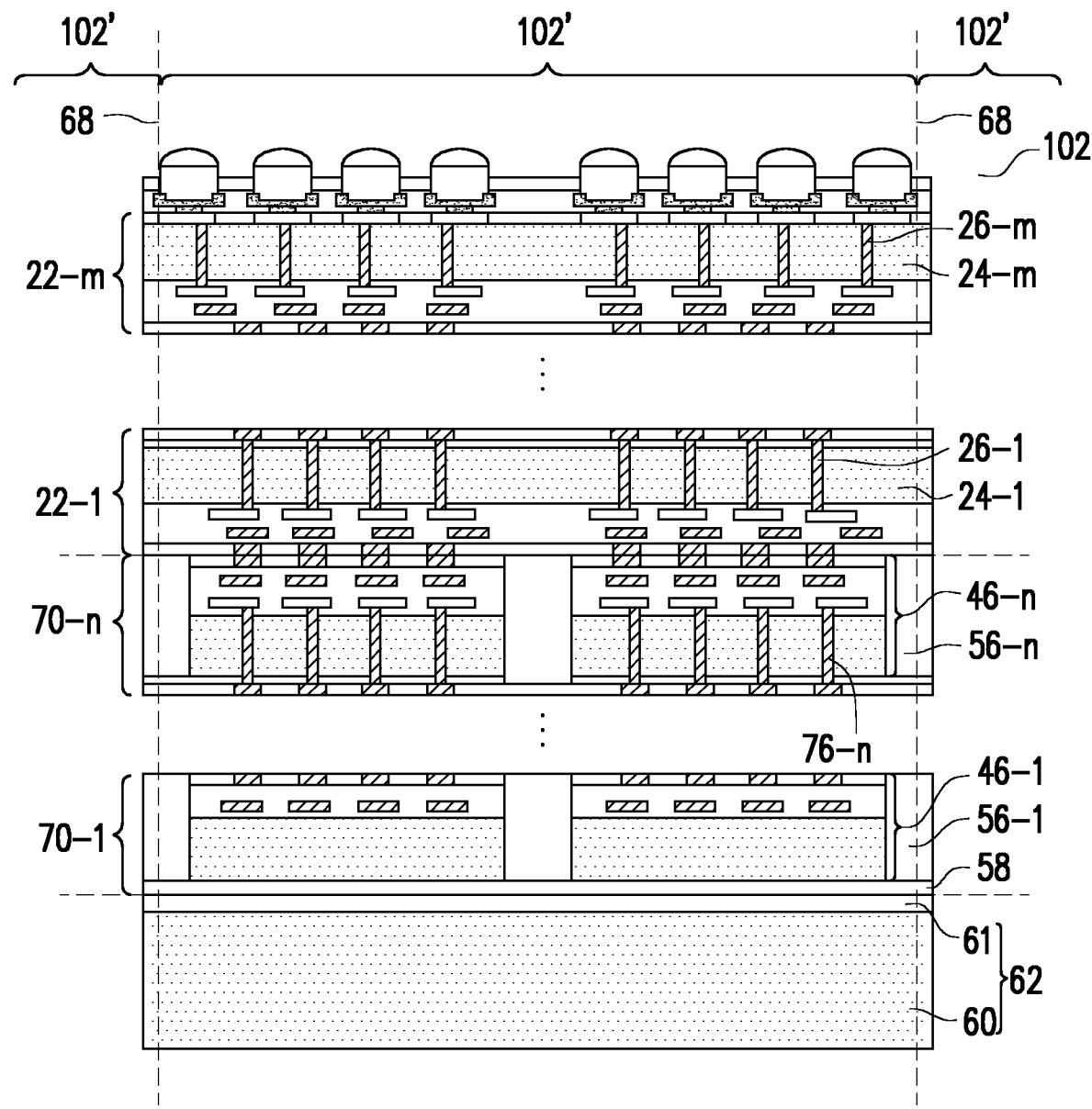

FIGS. 25 and 26 illustrate the packages including stacked dies in accordance with some embodiments. These embodiments are similar to the embodiments shown in FIGS. 1 through 8, except more tiers of wafers and chips are bonded. The formation processes thus include the processes shown in FIGS. 19 through 24, except the formation processes of the additional tiers are added. FIG. 25 illustrates the cross-sectional view of reconstructed wafer 102 and the singulated packages 102' in accordance with alternative embodiments. The reconstructed wafer 102 includes wafer 22-1, and wafer 22-2 over and bonding to wafer 22-1 through hybrid bonding. The bonding may be face-to-back bonding with the face of wafer 22-2 bonding to the back of wafer 22-1. Chips 46-2 and gap-fill regions 56-2 are underling and bonding to wafer 22-1 to form reconstructed wafer 70-2. The bonding may be face-to-face bonding, with the faces of chips 46-2 bonding to the face of wafer 22-1. Chips 46-1 and gap-fill regions 56-1 are underling and bonding to reconstructed wafer 70-2 to form reconstructed wafer 70-1. The bonding may be Back-to-face bonding, with the backs of chips 46-2 bonding to the faces of chips 46-1. The formation of reconstructed wafers 70-1 and 70-2 may be similar to the formation of reconstructed wafer 70 as shown in FIGS. 19-21. The rest of the processes may be realized by referring to the processes shown in FIGS. 1 through 8 and FIGS. 19 and 24. The bonding between wafer 22-1 and 22-2, between wafer 22-1 and reconstructed wafer 70-2, and between reconstructed wafers 70-1 and 70-2 may be hybrid bonding. In the resulting reconstructed wafer 102 and packages 102', base layer 60, dielectric layer 61, and may be or may not be removed from reconstructed wafer 102 and packages 102', similar to what has been discussed referring to FIG. 8.

FIG. 26 illustrates the cross-sectional view of reconstructed wafer 102 and the singulated packages 102' in accordance with yet alternative embodiments. These embodiments are similar to the embodiments shown in FIG. 25, except that there may be more tiers of wafers 22 (including 22-1 through 22-m) and reconstructed wafers 70 (including 70-1 through 70-n). In accordance with some embodiments, each of integers m and n may be any integer greater than 2, such as 3, 4, 5, or greater. The formation process may be realized by referring to the discussions of the preceding embodiments. In the resulting reconstructed wafer 102 and packages 102', base layer 60, dielectric layer 61, and may be or may not be removed from reconstructed wafer 102 and packages 102', similar to what has been discussed referring to FIG. 8.

In accordance with some embodiments shown in FIGS. 9, 10, 17, 18, 25, and 26, all wafers 22 may be formed using technologies older than the technologies for forming chips 46. Accordingly, the critical dimensions (the widths of the gates of) of the transistors in all chips 46 may be smaller than the critical dimensions of the transistors in all of wafer 22 in accordance with some example embodiments. In accordance with other embodiments, some wafers 22 may be formed using a newer technology than some chips 46.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good chips to increase the yield and decrease costs.

The embodiments of the present disclosure have some advantageous features. By combining wafers and chips to form packages with stacked chips, the throughput is improved because bonding the wafers saves the effort of picking-and-placing chips one-by-one. Also, the requirement of improving yield, the requirements of improving throughput, and the requirement of reducing manufacturing cost are balanced. For example, for the older generation of circuits in which the manufacturing process is more mature and the yield is high, wafer can be adopted since it is less likely any of the chips in the wafer is defective. On the other hand, for the chips manufactured using more recent and demanding technologies, discrete chips may be used for forming the packages since known-good-dies may be individually picked and used, and defective chips will not be bonded into packages.

In accordance with some embodiments of the present disclosure, a method comprises bonding a first wafer to a first carrier, wherein the first wafer comprises a semiconductor substrate, and a first plurality of through-vias extending into the semiconductor substrate; bonding a first plurality of chips over the first wafer, with gaps located between the first plurality of chips; performing a gap-filling process to form gap-filling regions in the gaps; bonding a second carrier onto the first plurality of chips and the gap-filling regions; de-bonding the first carrier from the first wafer; and forming electrical connectors electrically connecting to conductive features in the first wafer, wherein the electrical connectors are electrically connected to the first plurality of chips through the first plurality of through-vias. In an embodiment, a front side of the first wafer is bonded to the first carrier, and wherein the method further comprises: polishing the semiconductor substrate to reveal the first plurality of through-vias; and forming bond pads to electrically connect to the first plurality of through-vias. In an embodiment, the first wafer is bonded to the first carrier through fusion bonding. In an embodiment, the method further comprises forming a first dielectric layer as a surface layer of the first carrier, wherein the first dielectric layer is bonded to a second dielectric layer in the first wafer. In an embodiment, the first plurality of chips are bonded over the first wafer through hybrid bonding. In an embodiment, the method further comprises, before bonding the first plurality of chips over the first wafer, bonding a second wafer over the first wafer, wherein the first plurality of chips are further bonded over the second wafer. In an embodiment, the method further comprises bonding a second plurality of chips onto the first plurality of chips. In an embodiment, the method further comprises de-bonding the second carrier from the first plurality of chips. In an embodiment, the method further comprises performing a singulation process to separate the first plurality of chips and additional chips in the first wafer into a plurality of packages, wherein each of the plurality of packages comprises a portion of the second carrier. In an embodiment, the bonding the first wafer to the first carrier comprises bonding the first wafer to a blank silicon wafer.

In accordance with some embodiments of the present disclosure, a method comprises forming gap-filling regions to fill gaps between a plurality of chips to form a reconstructed wafer; bonding a wafer with the plurality of chips, wherein the wafer comprises a semiconductor substrate extending to all edges of the wafer; and a plurality of through-vias extending from a front surface to an intermediate level of the semiconductor substrate, wherein the intermediate level is between the front surface and a back surface of the semiconductor substrate; thinning the semiconductor substrate to reveal the plurality of through-vias; and forming a plurality of electrical connectors electrically connecting to the plurality of through-vias. In an embodiment, the method further comprises bonding the wafer to a carrier, wherein the bonding the plurality of chips to the wafer is performed at a time the wafer is bonded to the carrier, and before the gap-filling regions are formed. In an embodiment, the method further comprises, after the gap-filling regions are formed, de-bonding the carrier from the wafer. In an embodiment, the method further comprises bonding the plurality of chips to a carrier, wherein the gap-filling regions are formed on the plurality of chips that have been bonded to the carrier. In an embodiment, the method further comprises, before bonding the wafer with the plurality of chips, de-bonding the carrier from the plurality of chips and the gap-filling regions, wherein when the wafer is bonded with the plurality of chips, the plurality of chips are in the reconstructed wafer.

In accordance with some embodiments of the present disclosure, a method comprises bonding a front side of a first wafer to a first carrier; with the first wafer bonding to the first carrier, thinning a semiconductor substrate of the first wafer to reveal a plurality of through-vias in the first wafer; forming a first plurality of bond pads and a first dielectric layer on a backside of the first wafer; bonding a plurality of chips to the first plurality of bond pads and the first dielectric layer through hybrid bonding; de-bonding the first carrier from the first wafer and the plurality of chips; and forming electrical connectors on the front side of the first wafer, wherein the electrical connectors are electrically connected to the plurality of through-vias. In an embodiment, the first wafer is bonded to the first carrier through fusion bonding, with a second dielectric layer in the first wafer bonding to the first carrier. In an embodiment, the method further comprises patterning the second dielectric layer to form openings; and electrically plating the electrical connectors in the openings. In an embodiment, the method further comprises, before the plurality of chips are bonded, bonding a second wafer to the first wafer, wherein both of the first wafer and the second wafer are located over the first carrier. In an embodiment, the method further comprises, before de-bonding the first carrier, bonding a second carrier, wherein the first carrier and second carrier are on opposite sides of the first wafer and the plurality of chips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first carrier comprising a blank silicon layer, and a surface layer over the blank silicon layer;
    bonding a first wafer to the surface layer of the first carrier, wherein the first wafer comprises a semiconductor substrate, and a first plurality of through-vias extending into the semiconductor substrate;
    bonding a first plurality of chips over the first wafer, with gaps located between the first plurality of chips;
    performing a gap-filling process to form gap-filling regions in the gaps;
    bonding a second carrier onto the first plurality of chips and the gap-filling regions;
    de-bonding the first carrier from the first wafer, wherein after the de-bonding the first carrier, the surface layer remains to be bonded to the first wafer; and
    forming electrical connectors electrically connecting to conductive features in the first wafer, wherein the electrical connectors are electrically connected to the first plurality of chips through the first plurality of through-vias.

2. The method of claim 1, wherein a front side of the first wafer is bonded to the first carrier, and wherein the method further comprises:
    polishing the semiconductor substrate to reveal the first plurality of through-vias; and
    forming bond pads to electrically connect to the first plurality of through-vias.

3. The method of claim 2, wherein the first wafer is bonded to the first carrier through fusion bonding.

4. The method of claim 3, wherein the surface layer is bonded to an additional dielectric layer in the first wafer.

5. The method of claim 1, wherein the first plurality of chips are bonded over the first wafer through hybrid bonding.

6. The method of claim 1 further comprising, before bonding the first plurality of chips over the first wafer, bonding a second wafer over the first wafer, wherein the first plurality of chips are further bonded over the second wafer.

7. The method of claim 1 further comprising bonding a second plurality of chips onto the first plurality of chips.

8. The method of claim 1 further comprising de-bonding the second carrier from the first plurality of chips.

9. The method of claim 1 further comprising performing a singulation process to separate the first plurality of chips and additional chips in the first wafer into a plurality of packages, wherein each of the plurality of packages comprises a piece of the surface layer.

10. A method comprising:
    forming gap-filling regions to fill gaps between a plurality of chips to form a reconstructed wafer;
    attaching the reconstructed wafer to a carrier;
    bonding a wafer with the plurality of chips, with the plurality of chips being between the wafer and the carrier, wherein the wafer comprises:
        a semiconductor substrate extending to all edges of the wafer; and
        a plurality of through-vias extending from a front surface to an intermediate level of the semiconductor substrate, wherein the intermediate level is between the front surface and a back surface of the semiconductor substrate;

thinning the semiconductor substrate to reveal the plurality of through-vias; and forming a plurality of electrical connectors electrically connecting to the plurality of through-vias.

11. The method of claim 10, wherein the bonding the plurality of chips to the wafer is performed at a time after the wafer is bonded to the carrier.

12. The method of claim 10, wherein the gap-filling regions are formed when the plurality of chips are on an additional carrier, and the method further comprising, after the gap-filling regions are formed, de-bonding the additional carrier from the reconstructed wafer.

13. A method comprising:

bonding a front side of a first wafer to a first carrier;

with the first wafer bonding to the first carrier, thinning a semiconductor substrate of the first wafer to reveal a plurality of through-vias in the first wafer;

forming a first plurality of bond pads and a first dielectric layer on a backside of the first wafer;

bonding a plurality of chips to the first plurality of bond pads and the first dielectric layer through hybrid bonding;

de-bonding the first carrier from the first wafer and the plurality of chips, wherein in the de-bonding, a blank silicon layer in the first carrier is removed from the first wafer, and a surface layer in the first carrier is left attached to the first wafer; and forming electrical connectors on the front side of the first wafer, wherein the electrical connectors are electrically connected to the plurality of through-vias.

14. The method of claim 13, wherein the first wafer is bonded to the first carrier through fusion bonding, with a second dielectric layer on the front side of in the first wafer bonding to the first carrier.

15. The method of claim 14 further comprising:

patterning the second dielectric layer to form openings; and electrically plating the electrical connectors, wherein parts of the electrical connectors extend into the openings.

16. The method of claim 13 further comprising, before the plurality of chips are bonded, bonding a second wafer to the first wafer, wherein both of the first wafer and the second wafer are located over the first carrier.

17. The method of claim 13 further comprising, before de-bonding the first carrier, bonding a second carrier, wherein the first carrier and second carrier are on opposite sides of the first wafer and the plurality of chips.

18. The method of claim 9, wherein at a time the singulation process is performed, the surface layer is exposed.

19. The method of claim 10, wherein the reconstructed wafer is attached to a surface dielectric layer of the carrier, wherein the carrier further comprises a silicon layer underlying the surface dielectric layer, and the method further comprises removing the silicon layer to reveal the surface dielectric layer.

20. The method of claim 19 further comprising sawing the reconstructed wafer and the wafer to form a plurality of packages, wherein each of the packages comprises a piece of the surface dielectric layer.

* * * * *